United States Patent
Jhan et al.

(10) Patent No.: US 12,205,985 B2
(45) Date of Patent: Jan. 21, 2025

(54) FIELD EFFECT TRANSISTOR WITH INACTIVE FIN AND METHOD

(71) Applicant: Taiwan Semiconductor Manufacturing Co., Ltd., Hsinchu (TW)

(72) Inventors: Yi-Ruei Jhan, Hsinchu (TW); Kuo-Cheng Chiang, Hsinchu (TW); Kuan-Lun Cheng, Hsinchu (TW); Chih-Hao Wang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 520 days.

(21) Appl. No.: 17/480,108

(22) Filed: Sep. 20, 2021

(65) Prior Publication Data
US 2022/0320280 A1 Oct. 6, 2022

Related U.S. Application Data

(60) Provisional application No. 63/169,125, filed on Mar. 31, 2021.

(51) Int. Cl.
| H01L 29/06 | (2006.01) |
| H01L 29/423 | (2006.01) |
| H01L 29/66 | (2006.01) |
| H01L 29/786 | (2006.01) |

(52) U.S. Cl.
CPC ...... *H01L 29/0665* (2013.01); *H01L 29/0649* (2013.01); *H01L 29/42392* (2013.01); *H01L 29/66742* (2013.01); *H01L 29/78696* (2013.01)

(58) Field of Classification Search
CPC ............ H01L 29/0665; H01L 29/0649; H01L 29/42392; H01L 29/66742; H01L 29/78696; H01L 29/66545; H01L 29/78618; H01L 21/823814; H01L 21/823807; H01L 21/82385; H01L 21/823878; H01L 29/165; H01L 29/7848; H01L 29/0673; H01L 29/66439; H01L 29/775; H01L 27/092; H01L 21/823431; H01L 21/823412; H01L 21/823437; H01L 21/823481; H01L 23/53257; H01L 23/535; B82Y 10/00
USPC ......... 257/288, 351, 365, 328, 308; 438/283
See application file for complete search history.

(56) References Cited

U.S. PATENT DOCUMENTS

| 9,236,267 | B2 | 1/2016 | De et al. |
| 9,502,265 | B1 | 11/2016 | Jiang et al. |
| 9,520,466 | B2 | 12/2016 | Holland et al. |
| 9,520,482 | B1 | 12/2016 | Chang et al. |
| 9,536,738 | B2 | 1/2017 | Huang et al. |

(Continued)

*Primary Examiner* — Natalia A Gondarenko
(74) *Attorney, Agent, or Firm* — Seed IP Law Group

(57) ABSTRACT

A device includes a substrate, a first stack of semiconductor nanostructures vertically overlying the substrate, and a gate structure surrounding the semiconductor nanostructures and abutting an upper side and first and second lateral sides of the first stack. A first epitaxial region laterally abuts a third lateral side of the first stack, and a second epitaxial region laterally abuts a fourth lateral side of the first stack. A first inactive fin laterally abuts the first epitaxial region, and a second inactive fin laterally abuts the second epitaxial region and is physically separated from the first inactive fin by the gate structure.

20 Claims, 20 Drawing Sheets

(56) References Cited

U.S. PATENT DOCUMENTS

| | | |
|---|---|---|
| 9,576,814 B2 | 2/2017 | Wu et al. |
| 9,608,116 B2 | 3/2017 | Ching et al. |
| 9,768,278 B1* | 9/2017 | Chui ................. H01L 29/66803 |
| 9,786,774 B2 | 10/2017 | Colinge et al. |
| 9,853,101 B2 | 12/2017 | Peng et al. |
| 9,881,993 B2 | 1/2018 | Ching et al. |
| 2019/0131415 A1* | 5/2019 | Cheng ............... H01L 29/78696 |
| 2019/0371673 A1* | 12/2019 | Ching ................... H01L 23/535 |
| 2020/0058649 A1* | 2/2020 | Ching ............. H01L 21/823418 |
| 2022/0013630 A1* | 1/2022 | Park .................... H01L 29/6656 |

* cited by examiner

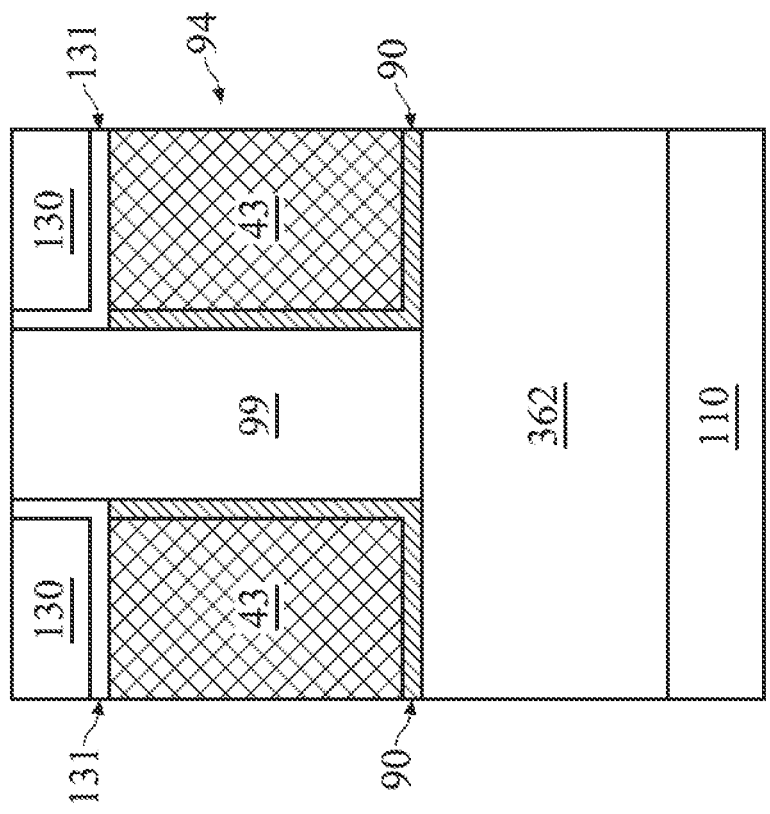
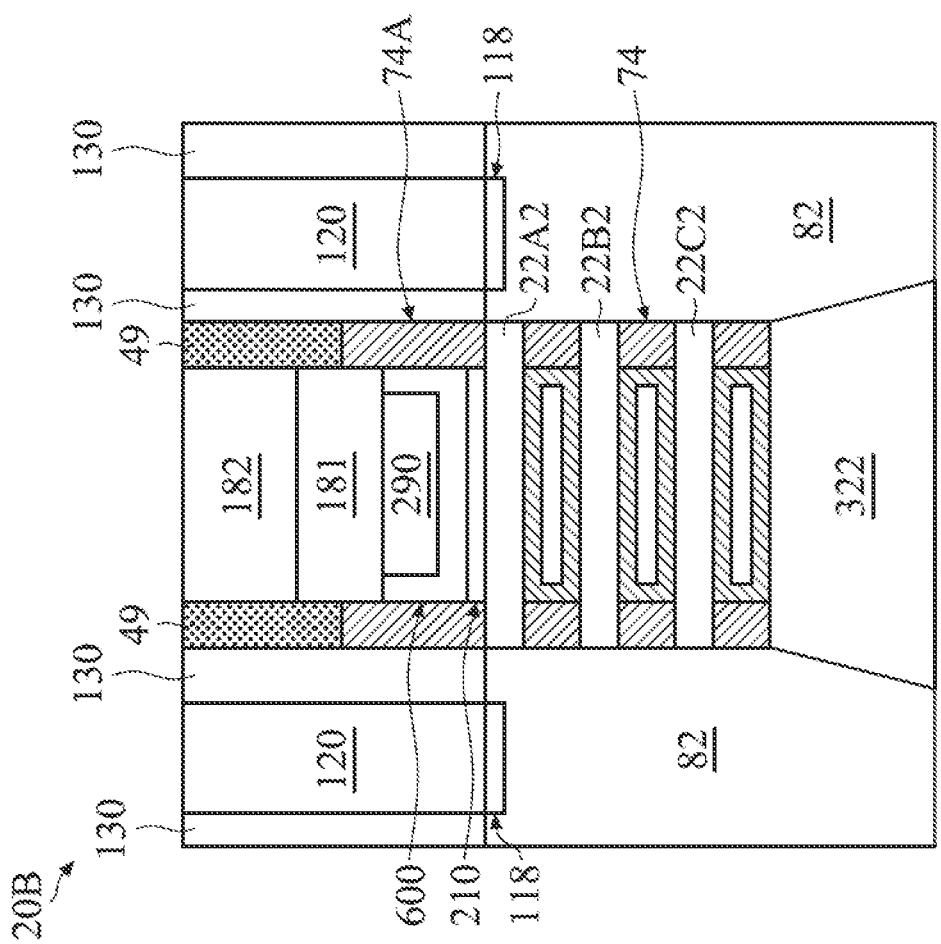
FIG. 1C
FIG. 1D

FIELD EFFECT TRANSISTOR WITH INACTIVE FIN AND METHOD

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A-1E are diagrammatic top and cross-sectional side views of a portion of an IC device fabricated according to embodiments of the present disclosure.

DETAILED DESCRIPTION

Figure 1A:
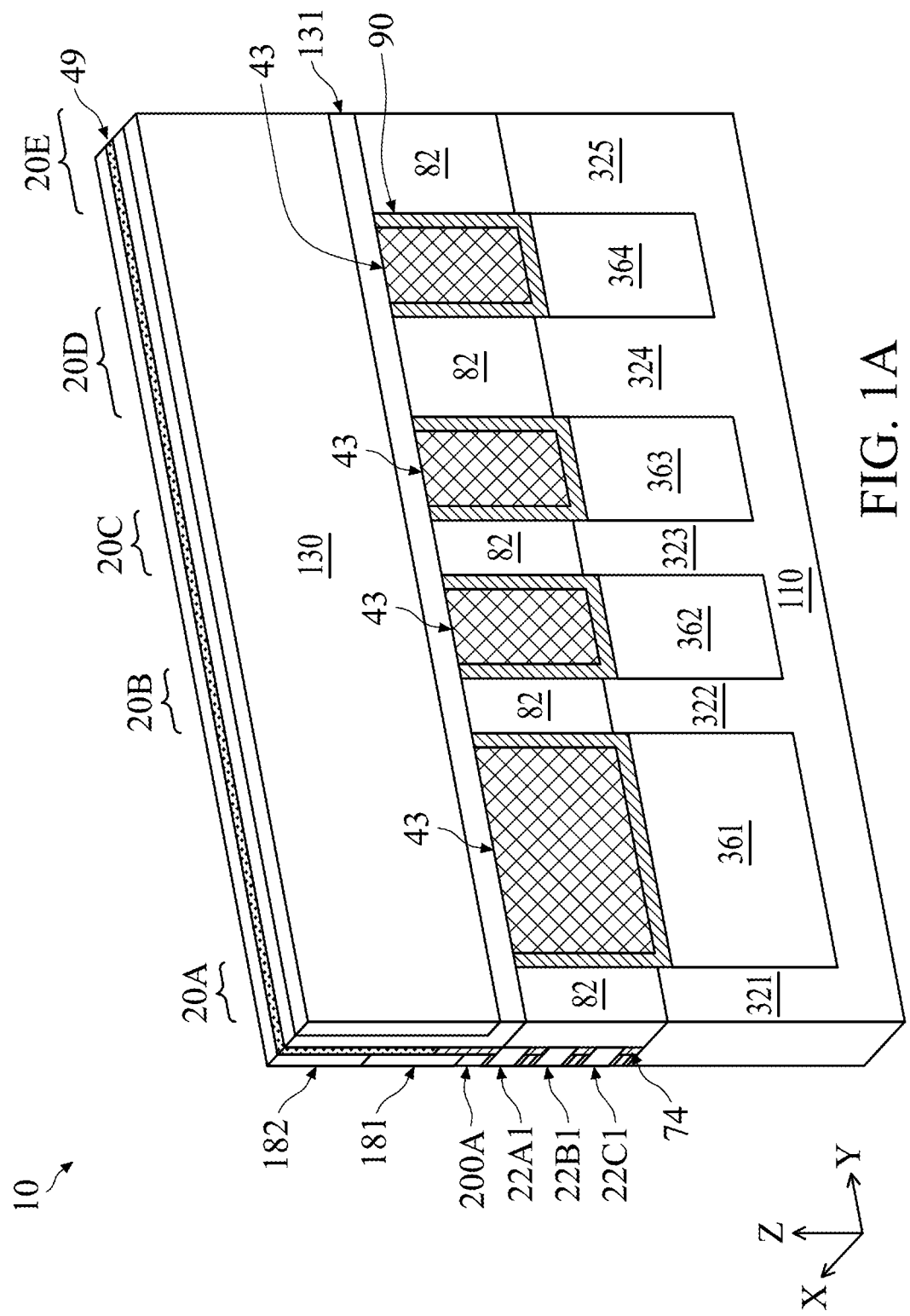
Figure 1B:
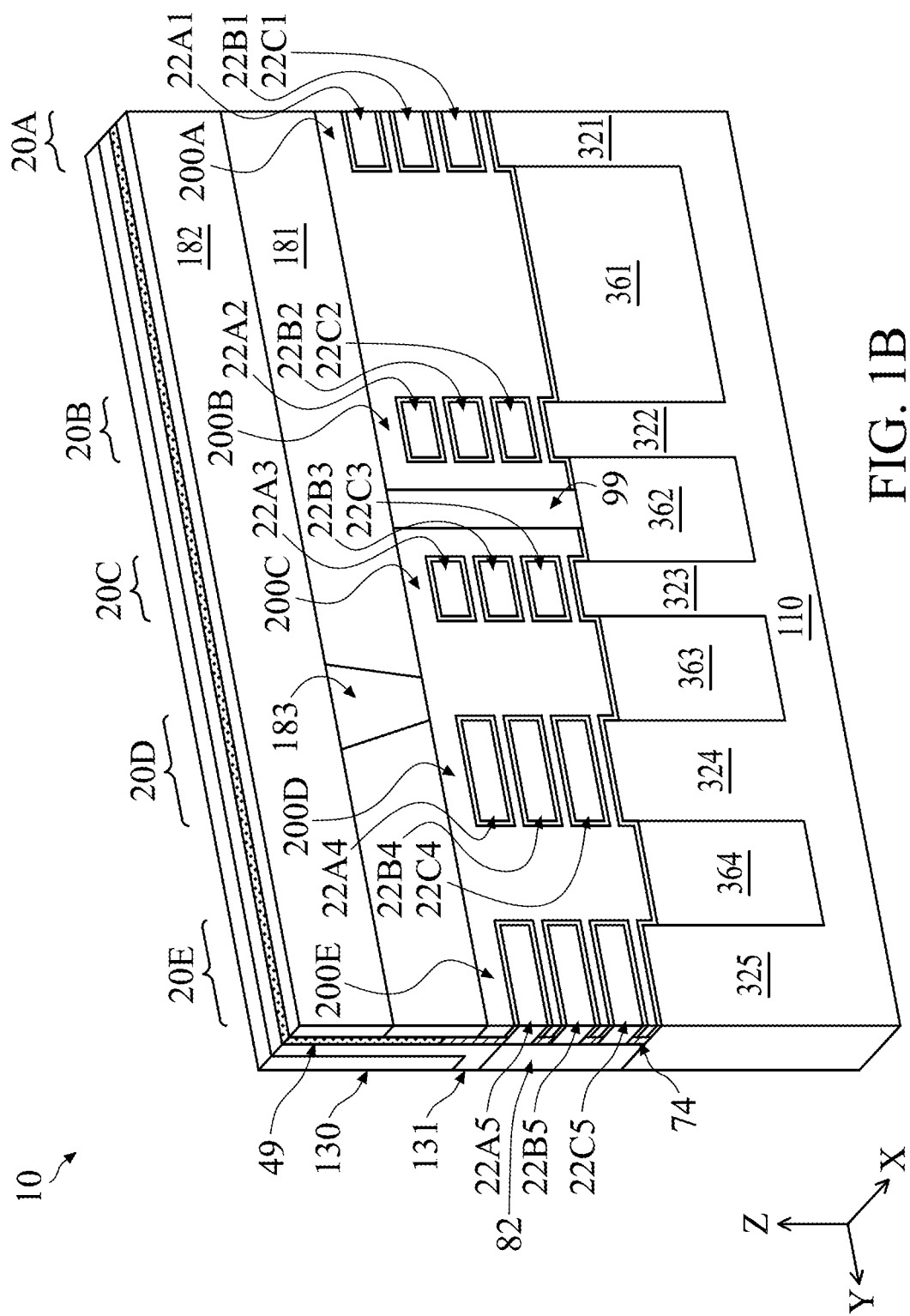

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Terms indicative of relative degree, such as "about," "substantially," and the like, should be interpreted as one having ordinary skill in the art would in view of current technological norms. Generally, the term "substantially" indicates a tighter tolerance than the term "about." For example, a thickness of "about 100 units" will include a larger range of values, e.g., 70 units to 130 units (+/−30%), than a thickness of "substantially 100 units," which will include a smaller range of values, e.g., 95 units to 105 units (+/−5%). Again, such tolerances (+/−30%, +/−5%, and the like) may be process- and/or equipment-dependent, and should not be interpreted as more or less limiting than a person having ordinary skill in the art would recognize as normal for the technology under discussion, other than that "about" as a relative term is not as stringent as "substantially" when used in a similar context.

The present disclosure is generally related to semiconductor devices, and more particularly to field-effect transistors (FETs), such as planar FETs, three-dimensional fin-like FETs (FinFETs), or gate-all-around (GAA) devices. In advanced technology nodes, cell scaling can be constrained by layout restrictions on active area (e.g., source/drain) spacing and/or semiconductor fin spacing. In many configurations, inactive (or "dummy" or "hybrid") fin structures are distributed between source/drain epitaxial features to prevent bridging between neighboring epitaxial features. In the embodiments described, spacing constraints that would normally be imposed by having the inactive fin structures located between active fin structures (such as nanosheet stacks) are alleviated by only forming the inactive fin structures between the source/drain epitaxial features, while leaving the active fin structures and overlying gate structures free of the inactive fin structures.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

FIGS. 1A-1E illustrate diagrammatic perspective, side and top views of a portion of an IC device 10 fabricated according to embodiments of the present disclosure, where the IC device 10 includes gate-all-around (GAA) devices 20A-20E. FIG. 1A is a diagrammatic perspective view of a portion of the IC device 10 including the GAA devices 20A-20E. Certain features are removed from view intentionally in the views of FIGS. 1A-1E for simplicity of illustration. The GAA devices 20A-20E may include at least an N-type FET (NFET) or a P-type FET (PFET) in some embodiments. Integrated circuit devices such as the IC device 10 frequently include transistors having different threshold voltages based on their function in the IC device. For example, input/output (IO) transistors typically have the highest threshold voltages, core logic transistors typically have the lowest threshold voltages, and a third threshold voltage between that of the IO transistors and that of the core logic transistors may also be employed for certain other functional transistors, such as static random access memory (SRAM) transistors. Some circuit blocks within the IC device 10 may include two or more NFETs and/or PFETs of two or more different threshold voltages.

The GAA devices 20A-20E are formed over and/or in a substrate 110, and generally include gate structures 200A-200E straddling semiconductor channels (e.g., semiconductor channels 22A1-22C1 of GAA device 20A), alternately referred to as "nanostructures," located over semiconductor fins 321-325 protruding from, and separated by, isolation structures 361-364. The channels are labeled "22AX" to "22CX," where "X" is an integer from 1 to 5, corresponding to the five transistors 20A-20E, respectively. Each gate structure 200A-200E controls current flow through the channels 22A1-22C5 (see, for example, FIG. 1B).

In many IC devices, it is preferable for the gate structures of two or more neighboring GAA devices to be electrically connected. Material layers of gate structures may be formed over a large number of adjacent semiconductor fins, and isolation structures formed before or after the material layers are used to "cut" the material layers to isolate certain portions of the material layers from other portions. Each portion of the material layers may be one or more gate structures corresponding to one or more GAA devices. For illustrative purposes, in the configuration shown in FIG. 1B, a single gate isolation structure 99 isolates the five gate structures 200A-200E, such that the gate structures 200A, 200B are electrically connected and the gate structures 200C-200E are electrically connected. The gate structures 200A, 200B are isolated from the gate structures 200C-200E by the gate isolation structure 99. The gate isolation structure 99 may alternatively be referred to as "dielectric plug 99." The gate isolation structure 99 extends from an upper surface of an isolation structure 362 to an upper surface of the gate structures 200A-200E. The gate isolation structure 99 further abuts one of multiple inactive fin structures 94 (including liner dielectric layer 90 and fill dielectric layer 43 overlying the isolation structure 362, shown in FIG. 1A). The inactive fin structures 94 laterally abut the gate structures 200A-200E and/or the gate isolation structure(s) 99 (e.g., in the X direction shown), and may extend from the upper surfaces of the semiconductor channels 22A1, 22A2, 22A3, 22A4, 22A5 to the upper surfaces of isolation structures 361-364.

In the various embodiments of the disclosure, the inactive fin structures 94 are formed in a self-aligned process prior to formation of the gate structures 200A-200E, and the gate isolation structures 99 are formed in another process (e.g., an EUV etching process) following formation of the gate structures 200A-200E. By forming the inactive fin structures 94 outside of the gate structures 200A-200E, active area (e.g., source/drain) spacing can be improved.

Referring to FIGS. 1C and 1D, the cross-sectional views of the IC device 10 in FIG. 1C and FIG. 1D are taken along an X-Z plane, where the X-direction is the horizontal direction, and the Z-direction is the vertical direction. The cross-sectional view in FIG. 1C shows a single GAA device 20B of the GAA devices 20A-20E for simplicity of illustration, and the related description is generally applicable to the other GAA devices 20A, 20C-20E. The channels 22A2-22C2 are laterally abutted by source/drain features 82, and covered and surrounded by the gate structure 200B. The gate structure 200B controls flow of electrical current through the channels 22A2-22C2 to and from the source/drain features 82 based on voltages applied at the gate structure 200B and at the source/drain features 82.

In some embodiments, the fin structure 322 includes silicon. In some embodiments, the GAA device 20B is an NFET, and the source/drain features 82 thereof include silicon phosphorous (SiP). In some embodiments, the GAA device 20B is a PFET, and the source/drain features 82 thereof include silicon germanium (SiGe).

The channels 22A2-22C2 each include a semiconductive material, for example silicon or a silicon compound, such as silicon germanium, or the like. The channels 22A2-22C2 are nanostructures (e.g., having sizes that are in a range of a few nanometers) and may also each have an elongated shape and extend in the X-direction. In some embodiments, the channels 22A2-22C2 each have a nanowire (NW) shape, a nanosheet (NS) shape, a nanotube (NT) shape, or other suitable nanoscale shape. The cross-sectional profile of the channels 22A2-22C2 may be rectangular, round, square, circular, elliptical, hexagonal, or combinations thereof.

In some embodiments, the lengths (e.g., measured in the X-direction) of the channels 22A2-22C2 may be different from each other, for example due to tapering during a fin etching process. In some embodiments, length of the channel 22A1 may be less than a length of the channel 22B1, which may be less than a length of the channel 22C1. The channels 22A2-22C2 each may not have uniform thickness, for example due to a channel trimming process used to expand spacing (e.g., measured in the Z-direction) between the channels 22A2-22C2 to increase gate structure fabrication process window. For example, a middle portion of each of the channels 22A2-22C2 may be thinner than the two ends of each of the channels 22A2-22C2. Such shape may be collectively referred to as a "dog-bone" shape.

In some embodiments, the spacing between the channels 22A2-22C2 (e.g., between the channel 22B2 and the channel 22A2 or the channel 22C2) is in a range between about 8 nanometers (nm) and about 12 nm. In some embodiments, a thickness (e.g., measured in the Z-direction) of each of the channels 22A2-22C2 is in a range between about 5 nm and about 8 nm. In some embodiments, a width (e.g., measured in the Y-direction, not shown in FIG. 1D, orthogonal to the X-Z plane) of each of the channels 22A2-22C2 is at least about 8 nm.

The gate structure 200B is disposed over and between the channels 22A2-22C2, respectively. In some embodiments, the gate structure 200B is disposed over and between the channels 22A2-22C2, which are silicon channels for N-type devices or silicon germanium channels for P-type devices. In some embodiments, the gate structure 200B includes an interfacial layer (IL) 210, one or more gate dielectric layers 600 and a metal fill layer 290. The gate structure 200B may further include one or more work function tuning layers 900 (see FIG. 12).

The interfacial layer 210, which may be an oxide of the material of the channels 22A2-22C2, may be formed on exposed areas of one or more of the channels 22A2-22C2 and the top surface of the fin 322. The interfacial layer 210 promotes adhesion of the gate dielectric layers 600 to the channels 22A2-22C2. In some embodiments, the interfacial layer 210 has thickness of about 5 Angstroms (Å) to about 50 Angstroms (Å). In some embodiments, the interfacial layer 210 has thickness of about 10 A. The interfacial layer 210 having thickness that is too thin may exhibit voids or insufficient adhesion properties. The interfacial layer 210 being too thick consumes gate fill window, which is related to threshold voltage tuning and resistance as described above. In some embodiments, the interfacial layer 210 is doped with a dipole, such as lanthanum, for threshold voltage tuning.

In some embodiments, the gate dielectric layer 600 includes at least one high-k gate dielectric material, which may refer to dielectric materials having a high dielectric constant that is greater than a dielectric constant of silicon oxide (k≈3.9). Exemplary high-k dielectric materials include $HfO_2$, HfSiO, HfSiON, HfTaO, HfTiO, HfZrO, $ZrO_2$, $Ta_2O_5$, or combinations thereof. In some embodiments, the gate dielectric layer 600 has thickness of about 5 A to about 100 A.

In some embodiments, the gate dielectric layer 600 may include dopants, such as metal ions driven into the high-k gate dielectric from $La_2O_3$, MgO, $Y_2O_3$, $TiO_2$, $Al_2O_3$, $Nb_2O_5$, or the like, or boron ions driven in from $B_2O_3$, at a concentration to achieve threshold voltage tuning. As one example, for N-type transistor devices, lanthanum ions in higher concentration reduce the threshold voltage relative to layers with lower concentration or devoid of lanthanum ions, while the reverse is true for P-type devices. In some embodiments, the gate dielectric layer 600 of certain transistor devices (e.g., IO transistors) is devoid of the dopant that is present in certain other transistor devices (e.g., N-type core logic transistors or P-type IO transistors). In N-type IO transistors, for example, relatively high threshold voltage is desirable, such that it may be preferable for the IO transistor high-k dielectric layers to be free of lanthanum ions, which would otherwise reduce the threshold voltage.

Figure 12:
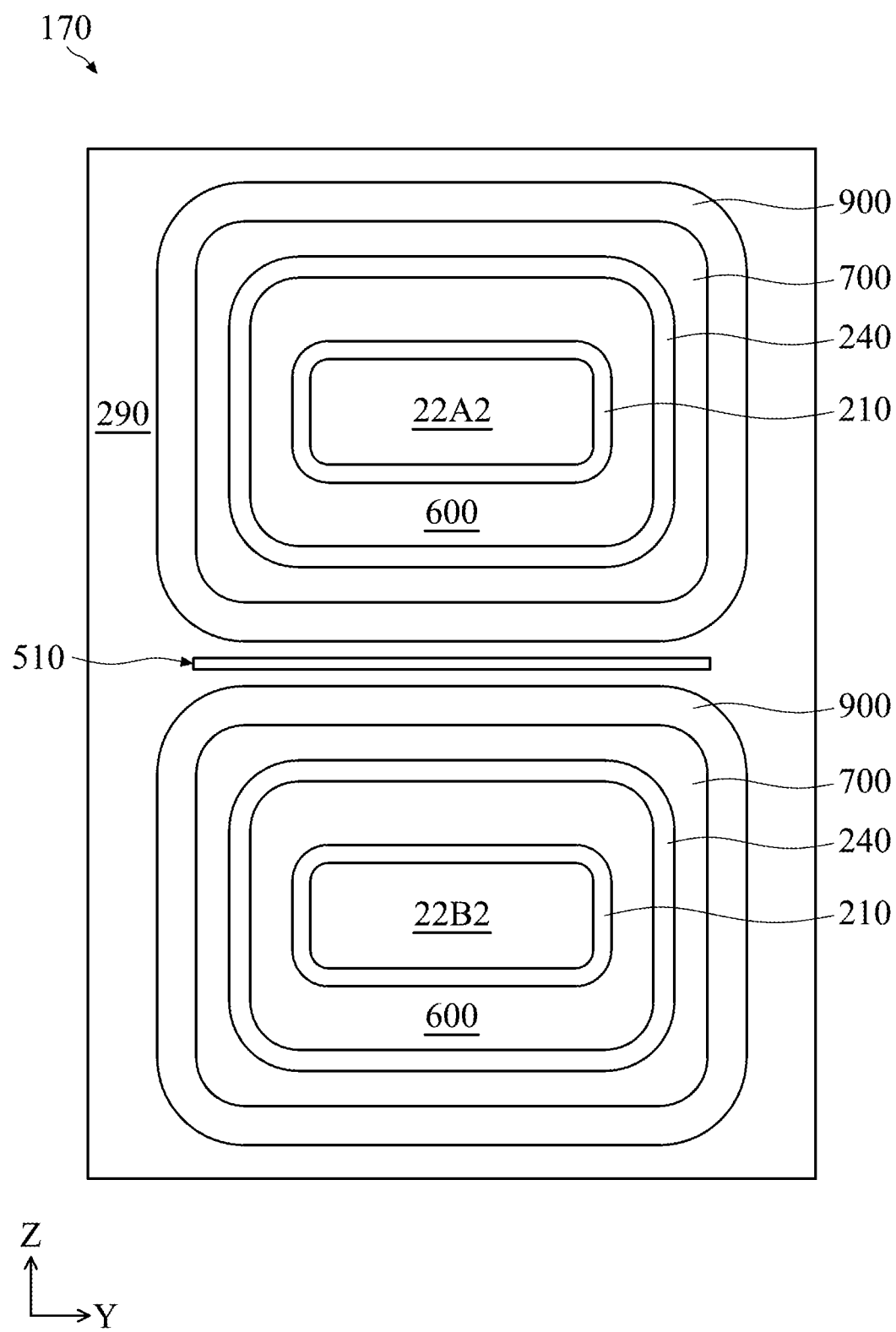

In some embodiments, the gate structure 200B further includes one or more work function metal layers, represented collectively as work function metal layer 900 (see FIG. 12). When configured as an NFET, the work function metal layer 900 of the GAA device 20B may include at least an N-type work function metal layer, an in-situ capping layer, and an oxygen blocking layer. In some embodiments, the N-type work function metal layer is or comprises an N-type metal material, such as TiAlC, TiAl, TaAlC, TaAl, or the like. The in-situ capping layer is formed on the N-type work function metal layer, and may comprise TiN, TiSiN, TaN, or another suitable material. The oxygen blocking layer is formed on the in-situ capping layer to prevent oxygen diffusion into the N-type work function metal layer, which would cause an undesirable shift in the threshold voltage. The oxygen blocking layer may be formed of a dielectric material that can stop oxygen from penetrating to the N-type work function metal layer, and may protect the N-type work function metal layer from further oxidation. The oxygen blocking layer may include an oxide of silicon, germanium, SiGe, or another suitable material. In some embodiments, the work function metal layer 900 includes more or fewer layers than those described.

The work function metal layer 900 may further include one or more barrier layers comprising a metal nitride, such as TiN, WN, MoN, TaN, or the like. Each of the one or more barrier layers may have thickness ranging from about 5 A to about 20 A. Inclusion of the one or more barrier layers provides additional threshold voltage tuning flexibility. In general, each additional barrier layer increases the threshold voltage. As such, for an NFET, a higher threshold voltage device (e.g., an IO transistor device) may have at least one or more than two additional barrier layers, whereas a lower threshold voltage device (e.g., a core logic transistor device) may have few or no additional barrier layers. For a PFET, a higher threshold voltage device (e.g., an IO transistor device) may have few or no additional barrier layers, whereas a lower threshold voltage device (e.g., a core logic transistor device) may have at least one or more than two additional barrier layers. In the immediately preceding discussion, threshold voltage is described in terms of magnitude. As an example, an NFET IO transistor and a PFET IO transistor may have similar threshold voltage in terms of magnitude, but opposite polarity, such as +1 Volt for the NFET IO transistor and −1 Volt for the PFET IO transistor. As such, because each additional barrier layer increases threshold voltage in absolute terms (e.g., +0.1 Volts/layer), such an increase confers an increase to NFET transistor threshold voltage (magnitude) and a decrease to PFET transistor threshold voltage (magnitude).

The gate structure 200B also includes metal fill layer 290. The metal fill layer 290 may include a conductive material such as tungsten, cobalt, ruthenium, iridium, molybdenum, copper, aluminum, or combinations thereof. Between the channels 22A2-22C2, the metal fill layer 290 are circumferentially surrounded (in the cross-sectional view) by the one or more work function metal layers 900, which are then circumferentially surrounded by the gate dielectric layers 600. The gate structure 200B may also include a glue layer that is formed between the one or more work function layers 900 and the metal fill layer 290 to increase adhesion. The glue layer is not specifically illustrated in FIGS. 1A-1D for simplicity.

The GAA devices 20A-20E also include gate spacers 49 and inner spacers 74 that are disposed on sidewalls of the gate dielectric layer 600 and the IL 210. The inner spacers 74 are also disposed between the channels 22A2-22C2. The gate spacers 49 and the inner spacers 74 may include a dielectric material, for example a low-k material such as SiOCN, SiON, SiN, or SiOC.

The GAA devices 20A-20E may further include source/drain contacts 120 that are formed over the source/drain features 82. The source/drain contacts 120 may include a conductive material such as tungsten, cobalt, ruthenium, iridium, molybdenum, copper, aluminum, or combinations thereof. The source/drain contacts 120 may be surrounded by barrier layers (not shown), such as SiN or TiN, which help prevent or reduce diffusion of materials from and into the source/drain contacts 120. A silicide layer 118 may also be formed between the source/drain features 82 and the source/drain contacts 120, so as to reduce the source/drain contact resistance. The silicide layer may contain a metal silicide material, such as cobalt silicide in some embodiments, or TiSi in some other embodiments.

The GAA devices 20A-20E further include an interlayer dielectric (TLD) 130. The ILD 130 provides electrical isolation between the various components of the GAA devices 20A-20E discussed above, for example between the gate structure 200B and the source/drain contacts 120. An etch stop layer 131 may be formed prior to forming the ILD 130, and may be positioned laterally between the ILD 130 and the gate spacers 49 and vertically between the ILD 130 and the source/drain features 82.

FIG. 1D is a cross-sectional side view in the X-Z plane taken at the isolation feature 362. In embodiments of the disclosure, the gate isolation feature 99 is abutted on two opposing sides by the inactive fin structures 94, and abutted on the other two opposing sides (see FIG. 1B) by the gate structures 200B, 200C. In some embodiments, the gate isolation feature 99 has substantially the same width as the gate structures 200A-200E in the X-direction, and extends laterally from the first dielectric layer 90 on one side to the first dielectric layer 90 on the opposing side. In some embodiments, the gate isolation feature 99 directly contacts the isolation feature 362, the first dielectric layers 90 and the etch stop layers 131. In some embodiments, the gate isolation feature 99 is substantially the same height as, or has greater height than, the gate structures 200A-200E.

Figure 1E:
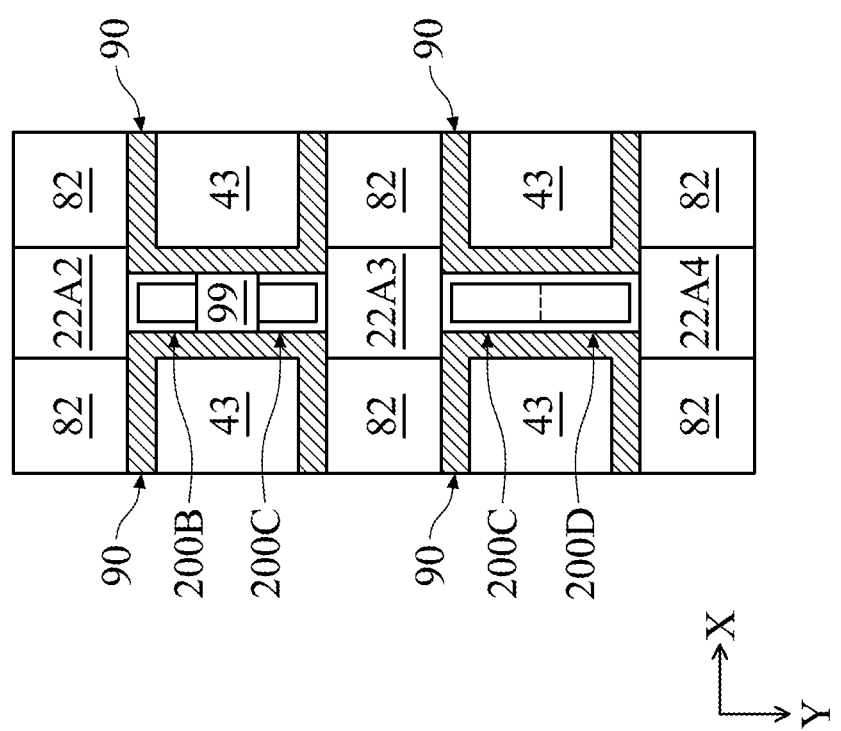

FIG. 1E is a cross-sectional top view in the X-Y plane taken at the nanostructures 22A2-22A4. As shown, each gate structure 200A-200E (gate structures 200B-200D are shown for simplicity of illustration) is abutted laterally by a first dielectric layer 90 surrounding a second dielectric layer 43. In some embodiments, the gate isolation structure 99 has first sidewalls that abut the first dielectric layers 90, and second sidewalls that abut the gate structures 200B, 200C. In some embodiments, the first sidewalls may extend partially into the first dielectric layer 90 (e.g., in the X-direction) due to etching into the first dielectric layer 90 when forming an opening in which the gate isolation structure 99 is subsequently formed.

Additional details pertaining to the fabrication of GAA devices are disclosed in U.S. Pat. No. 10,164,012, titled "Semiconductor Device and Manufacturing Method Thereof" and issued on Dec. 25, 2018, as well as in U.S. Pat. No. 10,361,278, titled "Method of Manufacturing a Semiconductor Device and a Semiconductor Device" and issued on Jul. 23, 2019, the disclosures of each which are hereby incorporated by reference in their respective entireties.

Figure 13:
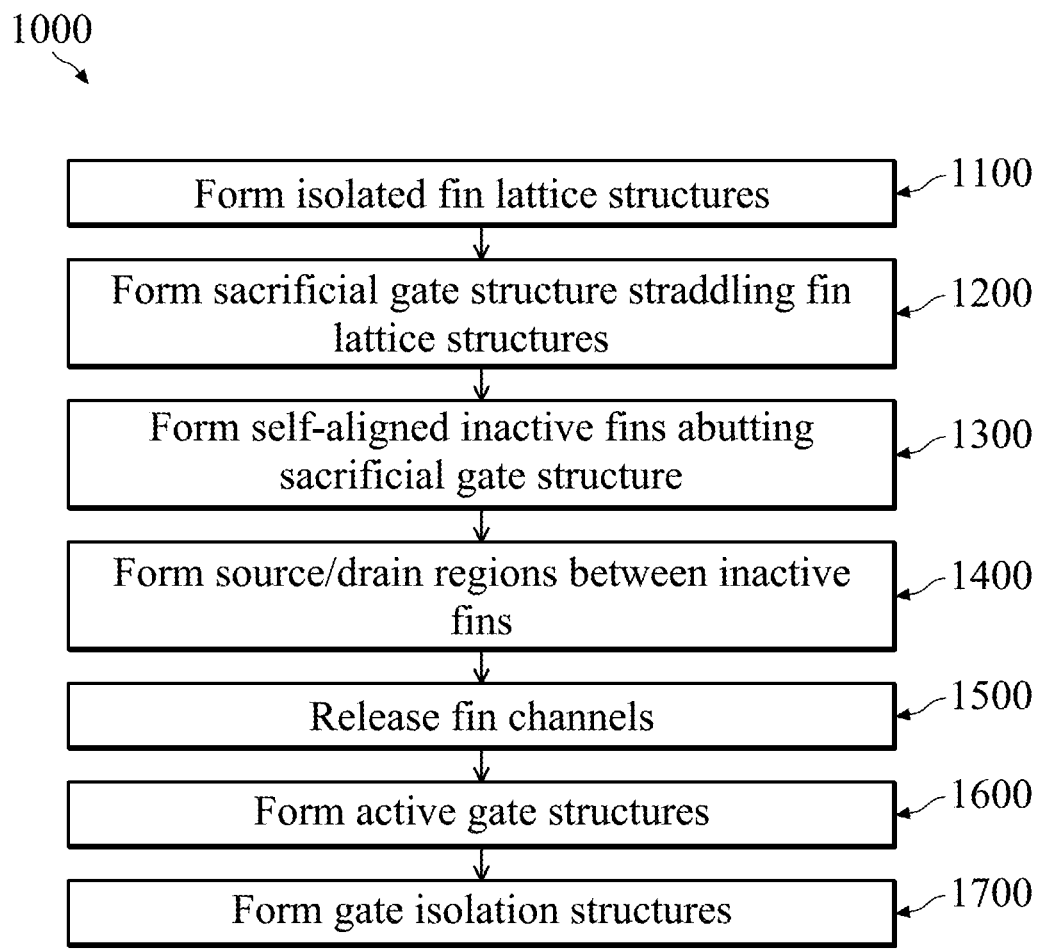
FIG. 13 is a flowchart illustrating a method of fabricating a semiconductor device according to various aspects of the present disclosure.

FIG. 13 illustrates a flowchart of a method 1000 for forming an IC device or a portion thereof from a workpiece, according to one or more aspects of the present disclosure. Method 1000 is merely an example and is not intended to limit the present disclosure to what is explicitly illustrated in method 1000. Additional acts can be provided before, during and after the method 1000, and some acts described can be replaced, eliminated, or moved around for additional embodiments of the methods. Not all acts are described herein in detail for reasons of simplicity. Method 1000 is described below in conjunction with fragmentary perspective and/or cross-sectional views of a workpiece, shown in FIGS. 2-11, at different stages of fabrication according to embodiments of method 1000. For avoidance of doubt, throughout the figures, the X direction is perpendicular to the Y direction and the Z direction is perpendicular to both the X direction and the Y direction. It is noted that, because the workpiece may be fabricated into a semiconductor device, the workpiece may be referred to as the semiconductor device as the context requires.

Figure 2:
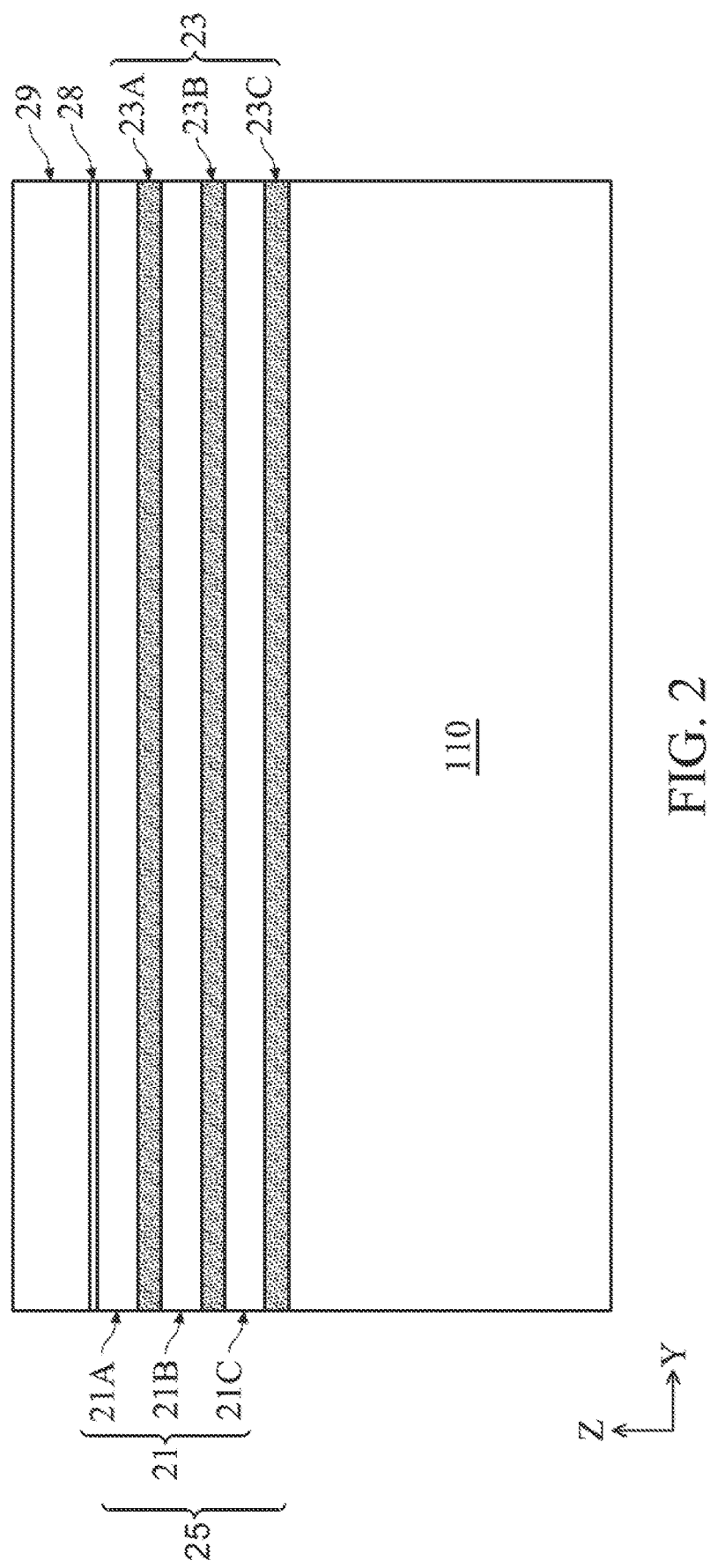
FIGS. 2-12 are views of various embodiments of an IC device of at various stages of fabrication according to various aspects of the present disclosure.

In FIG. 2, a substrate 110 is provided. The substrate 110 may be a semiconductor substrate, such as a bulk semiconductor, or the like, which may be doped (e.g., with a p-type or an n-type dopant) or undoped. The semiconductor material of the substrate 110 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. Other substrates, such as single-layer, multi-layered, or gradient substrates may be used.

Further in FIG. 2, a multi-layer stack 25 or "lattice" is formed over the substrate 110 of alternating layers of first semiconductor layers 21A-21C (collectively referred to as first semiconductor layers 21) and second semiconductor layers 23A-23C (collectively referred to as second semiconductor layers 23). In some embodiments, the first semiconductor layers 21 may be formed of a first semiconductor material suitable for n-type nanoFETs, such as silicon, silicon carbide, or the like, and the second semiconductor layers 23 may be formed of a second semiconductor material suitable for p-type nanoFETs, such as silicon germanium or the like. Each of the layers of the multi-layer stack 25 may be epitaxially grown using a process such as chemical vapor deposition (CVD), atomic layer deposition (ALD), vapor phase epitaxy (VPE), molecular beam epitaxy (MBE), or the like. As shown in FIG. 2, an oxide layer 28 and hard mask layer 29 are formed over the top first semiconductor layer 21A. In some embodiments, the oxide layer 28 is a pad oxide layer, and the hard mask layer 29 may include silicon. In some embodiments, the hard mask layer 29 includes SiOCN, or another suitable silicon-based dielectric. In some embodiments, the oxide layer 28 is not present, and the hard mask layer 29 is in direct contact with the top first semiconductor layer 21A.

Three layers of each of the first semiconductor layers 21 and the second semiconductor layers 23 are illustrated. In some embodiments, the multi-layer stack 25 may include one or two each or four or more each of the first semiconductor layers 21 and the second semiconductor layers 23. Although the multi-layer stack 25 is illustrated as including a second semiconductor layer 23C as the bottommost layer, in some embodiments, the bottommost layer of the multi-layer stack 25 may be a first semiconductor layer 21.

Due to high etch selectivity between the first semiconductor materials and the second semiconductor materials, the second semiconductor layers 23 of the second semiconductor material may be removed without significantly removing the first semiconductor layers 21 of the first semiconductor material, thereby allowing the first semiconductor layers 21 to be patterned to form channel regions of nanoFETs. In some embodiments, the first semiconductor layers 21 are removed and the second semiconductor layers 23 are patterned to form channel regions. The high etch selectivity allows the first semiconductor layers 21 of the first semiconductor material to be removed without significantly removing the second semiconductor layers 23 of the second semiconductor material, thereby allowing the second semiconductor layers 23 to be patterned to form channel regions of nanoFETs.

Figure 3:
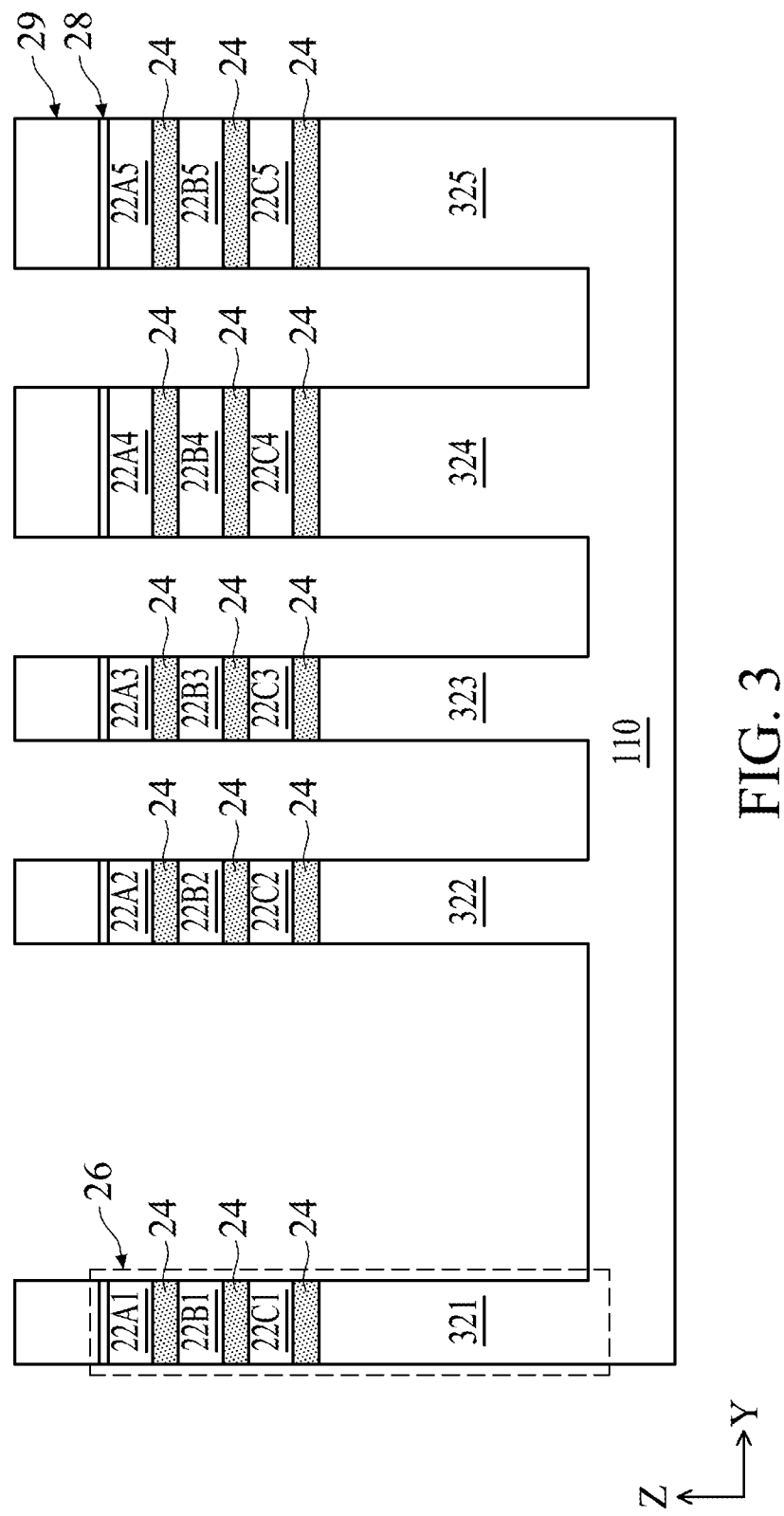

In FIG. 3, fins 321-325 are formed in the substrate 110 and nanostructures 22, 24 are formed in the multi-layer stack 25 corresponding to operation 1100 of FIG. 13. In some embodiments, the nanostructures 22, 24 and the fins 32 may be formed by etching trenches in the multi-layer stack 25 and the substrate 110. The etching may be any acceptable etch process, such as a reactive ion etch (RIE), neutral beam etch (NBE), the like, or a combination thereof. The etching may be anisotropic. First nanostructures 22A1-22C5 (also referred to as "channels") are formed from the first semiconductor layers 21, and second nanostructures 24 are formed from the second semiconductor layers 23. Distance between adjacent fins 321-325 and nanostructures 22, 24 in the Y-direction may be from about 18 nm to about 100 nm.

The fins 321-325 and the nanostructures 22, 24 may be patterned by any suitable method. For example, one or more photolithography processes, including double-patterning or multi-patterning processes, may be used to form the fins 321-325 and the nanostructures 22, 24. Generally, double-patterning or multi-patterning processes combine photolithography and self-aligned processes, allowing for pitches smaller than what is otherwise obtainable using a single, direct photolithography process. As an example of one multi-patterning process, a sacrificial layer may be formed over a substrate and patterned using a photolithography process. Spacers are formed alongside the patterned sacrificial layer using a self-aligned process. The sacrificial layer is then removed, and the remaining spacers may then be used to pattern the fins 321-325. In some embodiments, the hard mask layer 29 is patterned, for example by a photolithography process, then the pattern is transferred by an etch process to form the fins 321-325 and the nanostructures 22, 24. Each of the fins 321-325 and its overlying nanostructures 22, 24 may be collectively referred to as a "fin stack." A fin stack 26 including the fin 321 and the nanostructures 22A1, 22B1, 22C1, 24 is outlined by a dashed line in FIG. 3. Five fin stacks 26 are shown in FIG. 3, though few or more than five fin stacks may also be formed by the patterning process.

FIG. 3 illustrates the fins 321-325 having vertically straight sidewalls. In some embodiments, the sidewalls are substantially vertical (non-tapered), such that width of the fins 321-325 and the nanostructures 22, 24 is substantially similar, and each of the nanostructures 22, 24 is rectangular in shape. In some embodiments, the fins 321-325 have tapered sidewalls, such that a width of each of the fins 321-325 and/or the nanostructures 22, 24 continuously increases in a direction towards the substrate 110. In such embodiments, each of the nanostructures 22, 24 may have a different width and be trapezoidal in shape.

Figure 4:
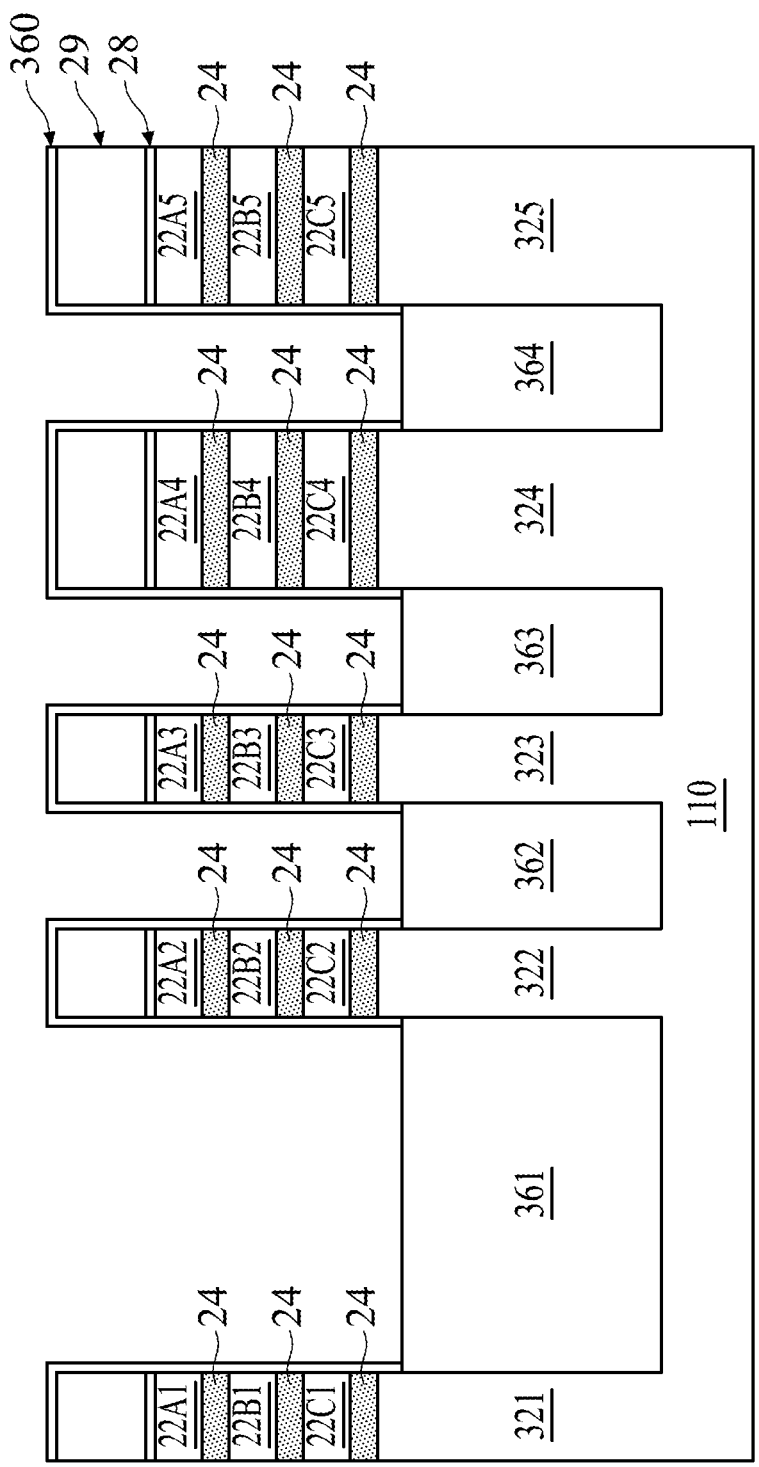

In FIG. 4, isolation regions 361-364, which may be shallow trench isolation (STI) regions, are formed adjacent and between the fins 321-325. The isolation regions 361-364 may be formed by depositing an insulation material layer 360 over the substrate 110, the fins 321-325, and nanostructures 22, 24, and between adjacent fins 321-325 and nanostructures 22, 24. The insulation material layer 360 may be an oxide, such as silicon oxide, a nitride, the like, or a combination thereof, and may be formed by high-density plasma CVD (HDP-CVD), flowable CVD (FCVD), the like, or a combination thereof. In some embodiments, a liner (not separately illustrated) may first be formed along surfaces of the substrate 110, the fins 321-325, and the nanostructures 22, 24. Thereafter, a fill material, such as those discussed above may be formed over the liner.

In some embodiments, the insulation material layer 360 undergoes a removal process, such as a chemical mechanical polish (CMP), an etch-back process, combinations thereof, or the like, to remove excess insulation material layer 360 over the nanostructures 22, 24. In some embodiments, top surfaces of the nanostructures 22, 24 may be exposed and level with the insulation material layer 360 after the removal process is complete. As shown in FIG. 4, the insulation material layer 360 may remain over the nanostructures 22, 24.

The insulation material layer 360 is then recessed to form the isolation regions 361-364. After recessing, the nanostructures 22, 24 and upper portions of the fins 321-325 may protrude from between neighboring isolation regions 361-364. The isolation regions 361-364 may have top surfaces that are flat as illustrated, convex, concave, or a combination thereof. In some embodiments, the isolation regions 361-364 are recessed by an acceptable etching process, such as an oxide removal using, for example, dilute hydrofluoric acid (dHF), which is selective to the insulation material layer 360 and leaves the fins 321-325 and the nanostructures 22, 24 substantially unaltered.

FIGS. 2 through 4 illustrate one embodiment (e.g., etch last) of forming the fins 321-325 and the nanostructures 22, 24. In some embodiments, the fins 321-325 and/or the nanostructures 22, 24 are epitaxially grown in trenches in a dielectric layer (e.g., etch first). The epitaxial structures may comprise the alternating semiconductor materials discussed above, such as the first semiconductor materials and the second semiconductor materials.

Further in FIG. 4, appropriate wells (not separately illustrated) may be formed in the fins 321-325, the nanostructures 22, 24, and/or the isolation regions 361-364. Using masks, an n-type impurity implant may be performed in p-type regions of the substrate 110, and a p-type impurity implant may be performed in n-type regions of the substrate 110. Example n-type impurities may include phosphorus, arsenic, antimony, or the like. Example p-type impurities may include boron, boron fluoride, indium, or the like. An anneal may be performed after the implants to repair implant damage and to activate the p-type and/or n-type impurities. In some embodiments, in situ doping during epitaxial growth of the fins 321-325 and the nanostructures 22, 24 may obviate separate implantations, although in situ and implantation doping may be used together.

Figure 5:
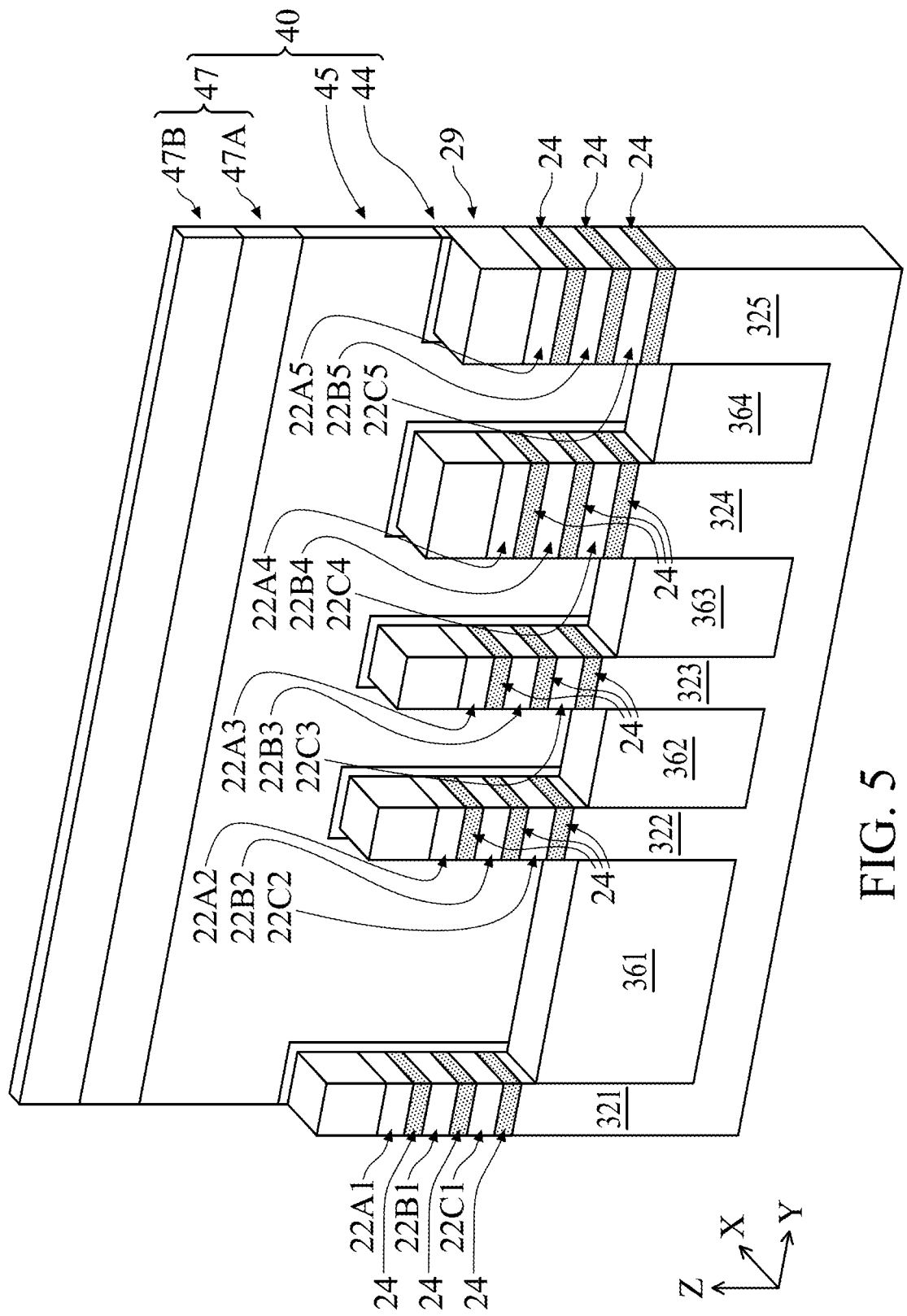

FIG. 5 is a perspective view of an intermediate stage of formation of the IC device 10 in accordance with various embodiments. Following recessing of the isolation regions 361-364, dummy (or "sacrificial") gate structures 40 are formed over the fins 321-325 and/or the nanostructures 22, 24, corresponding to operation 1200 of FIG. 13. A single dummy gate structure 40 is shown in FIG. 5, and many further dummy gate structures 40 may be formed substantially parallel and concurrently with the dummy gate structure 40 shown. In forming the dummy gate structure 40, a dummy gate layer 45 is formed over the fins 321-325 and/or the nanostructures 22, 24. The dummy gate layer 45 may be made of materials that have a high etching selectivity to the isolation regions 361-364. The dummy gate layer 45 may be a conductive, semiconductive, or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 45 may be deposited by physical vapor deposition (PVD), CVD, sputter deposition, or other techniques for depositing the selected material. A mask layer 47 is formed over the dummy gate layer 45, and may include, for example, silicon nitride, silicon oxynitride, or the like. In some embodiments, the mask layer includes a first layer 47A directly contacting the dummy gate layer 45, and a second layer 47B directly contacting the first layer 47A, as shown in FIG. 5. In some embodiments, a gate dielectric layer 44 is present between the dummy gate layer 45 and the fins 321-325 and/or the nanostructures 22, 24.

Further to FIG. 5, a removal process is performed to remove exposed portions of the insulation material layer 360 using the dummy gate structures 40 as a mask. Following the removal process, portions of the insulation material layer 360 under the dummy gate structure 40 may remain as the gate dielectric layer 44. In embodiments in which the insulation material layer 360 is removed immediately following formation of the isolation regions 361-365, the gate dielectric layer 44 may not be present between the dummy gate layer 45 and the hard mask layer 29.

Figure 6A:
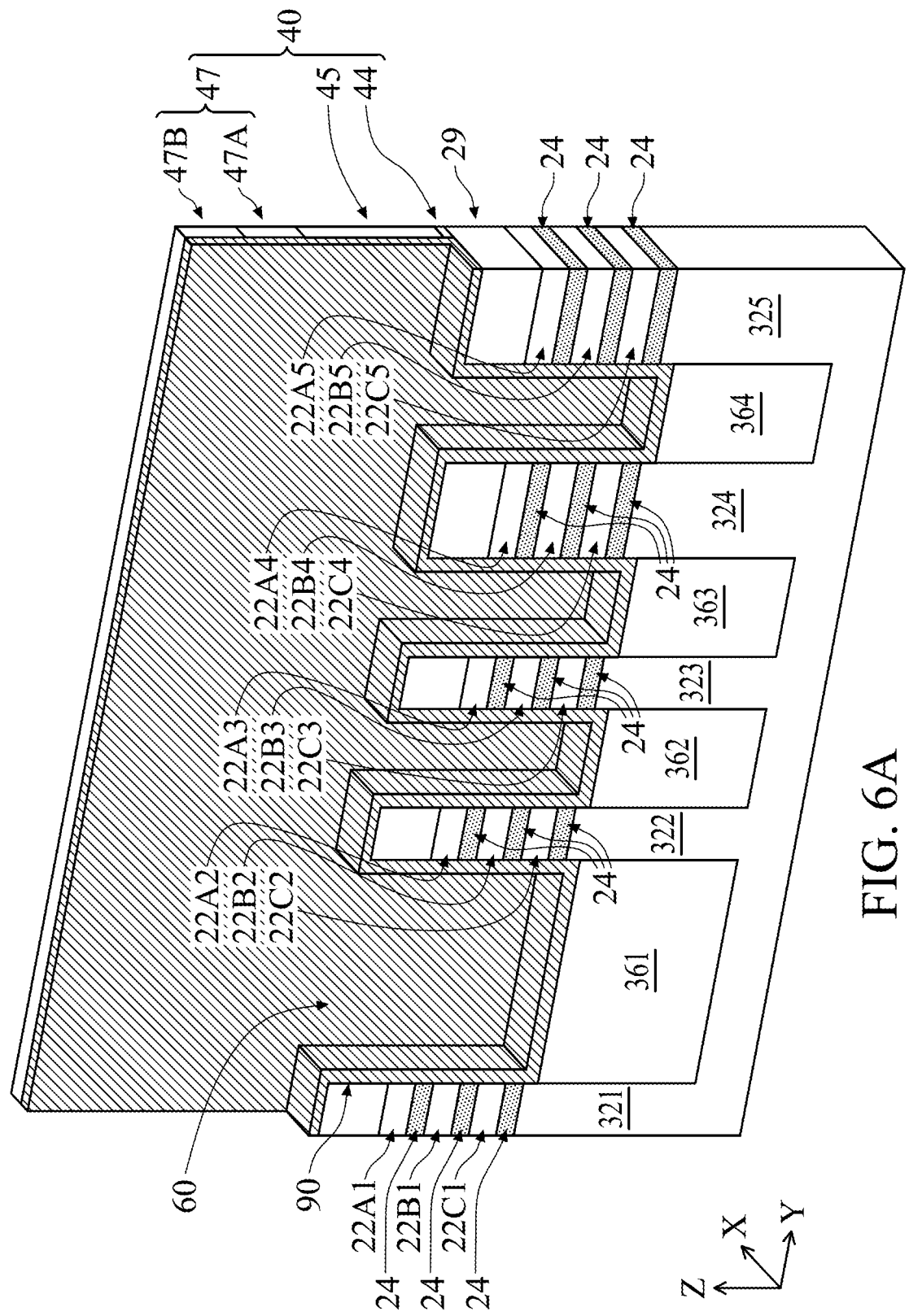
Figure 6B:
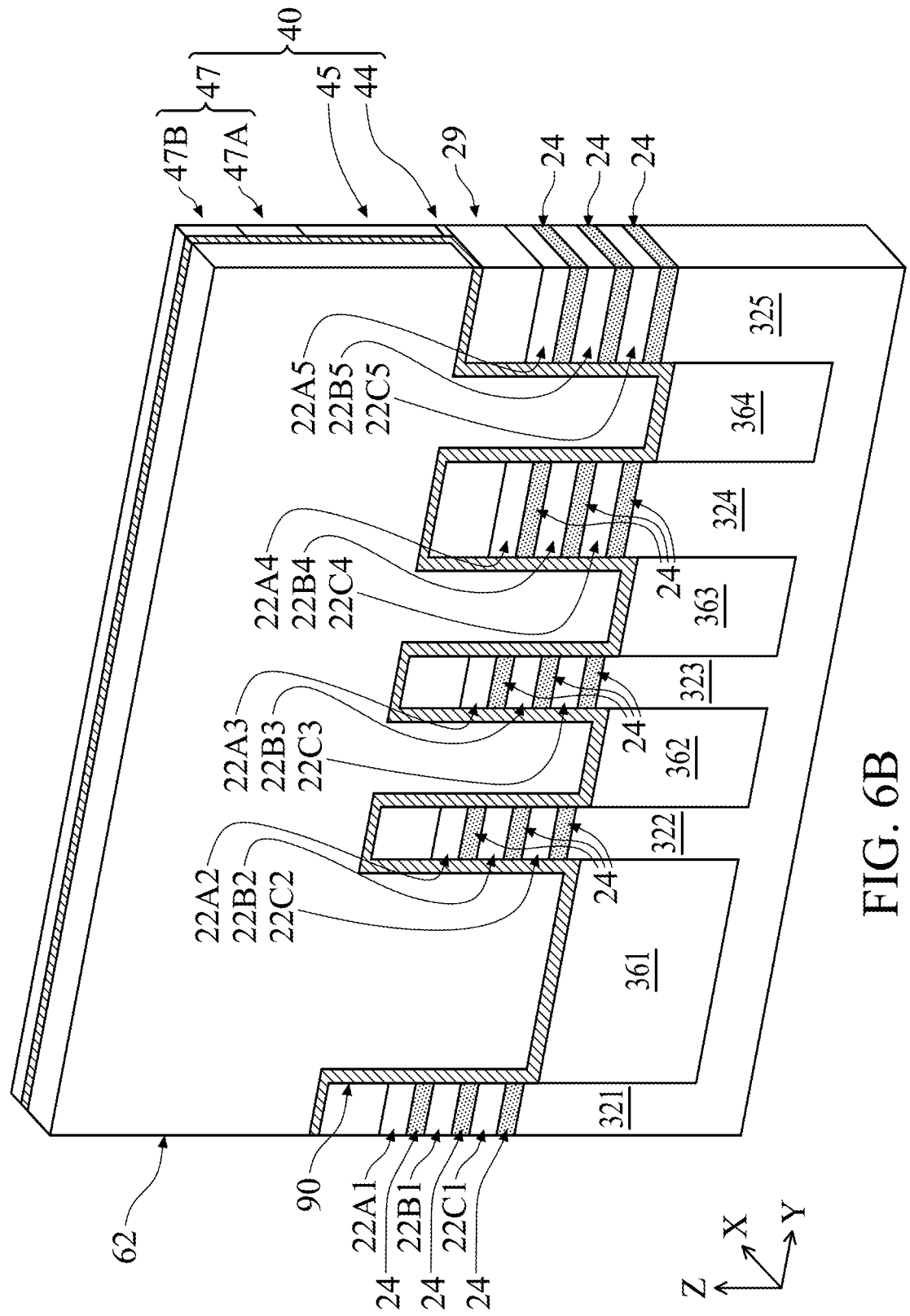
Figure 6C:
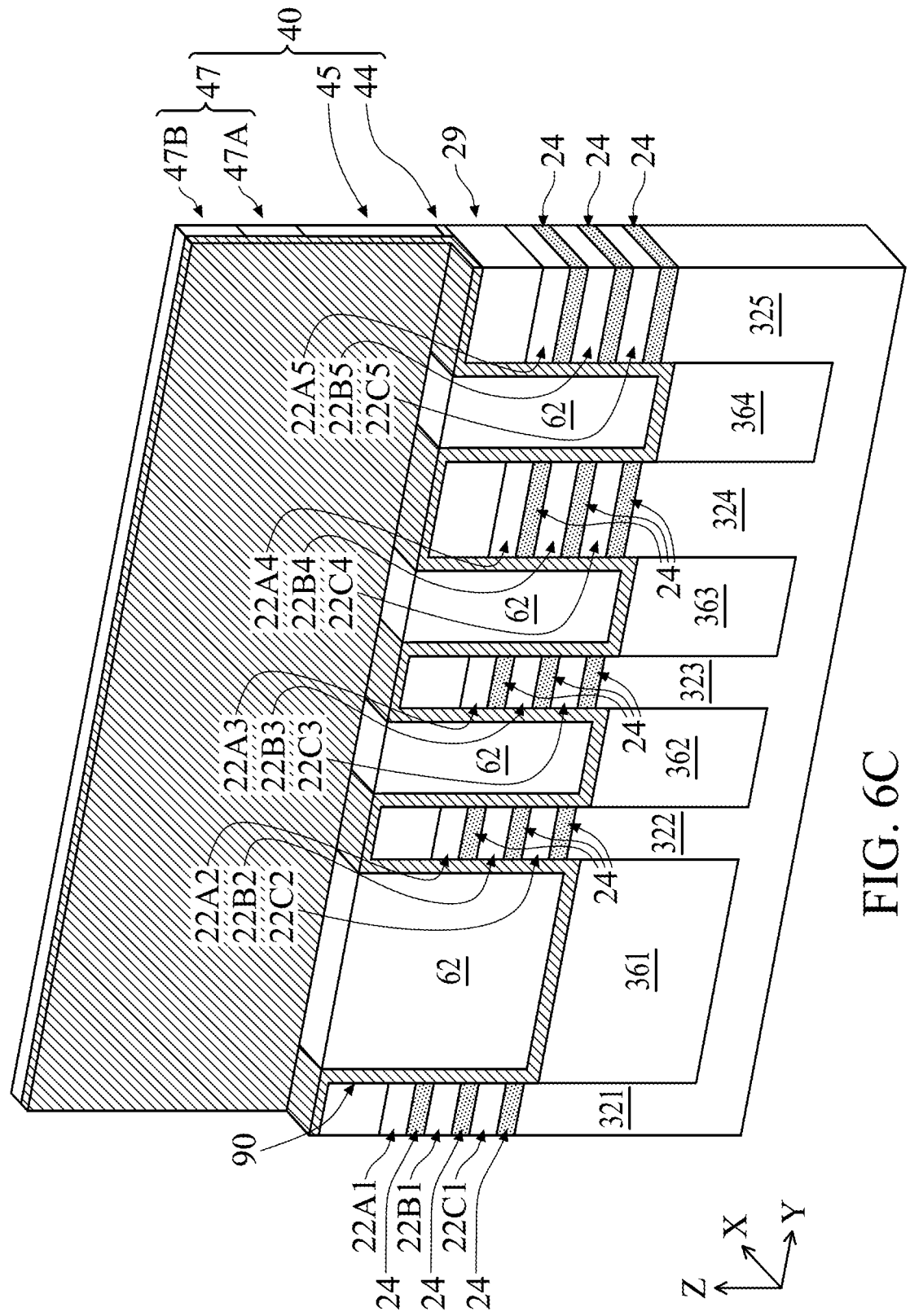
Figure 6D:
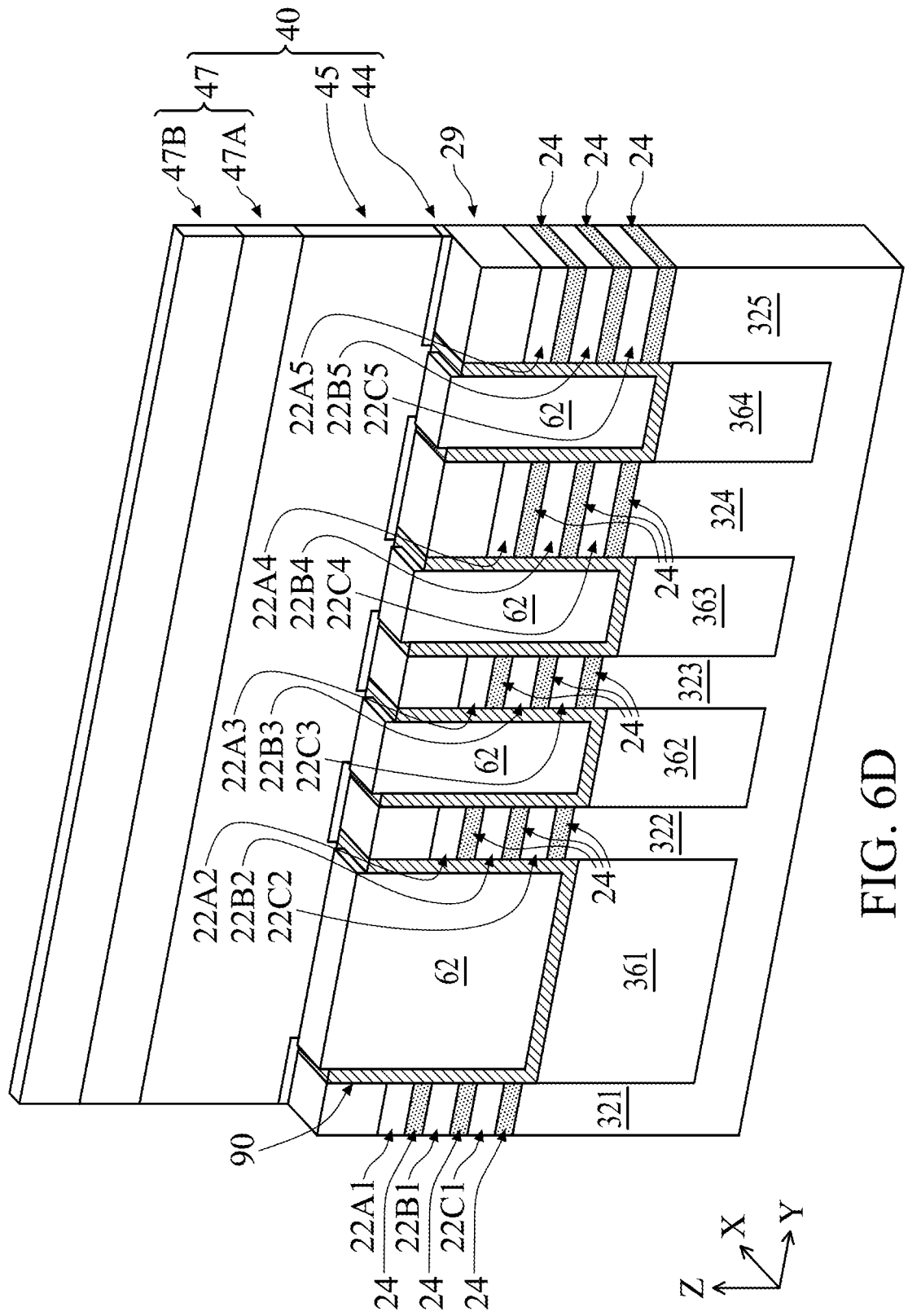
Figure 6E:
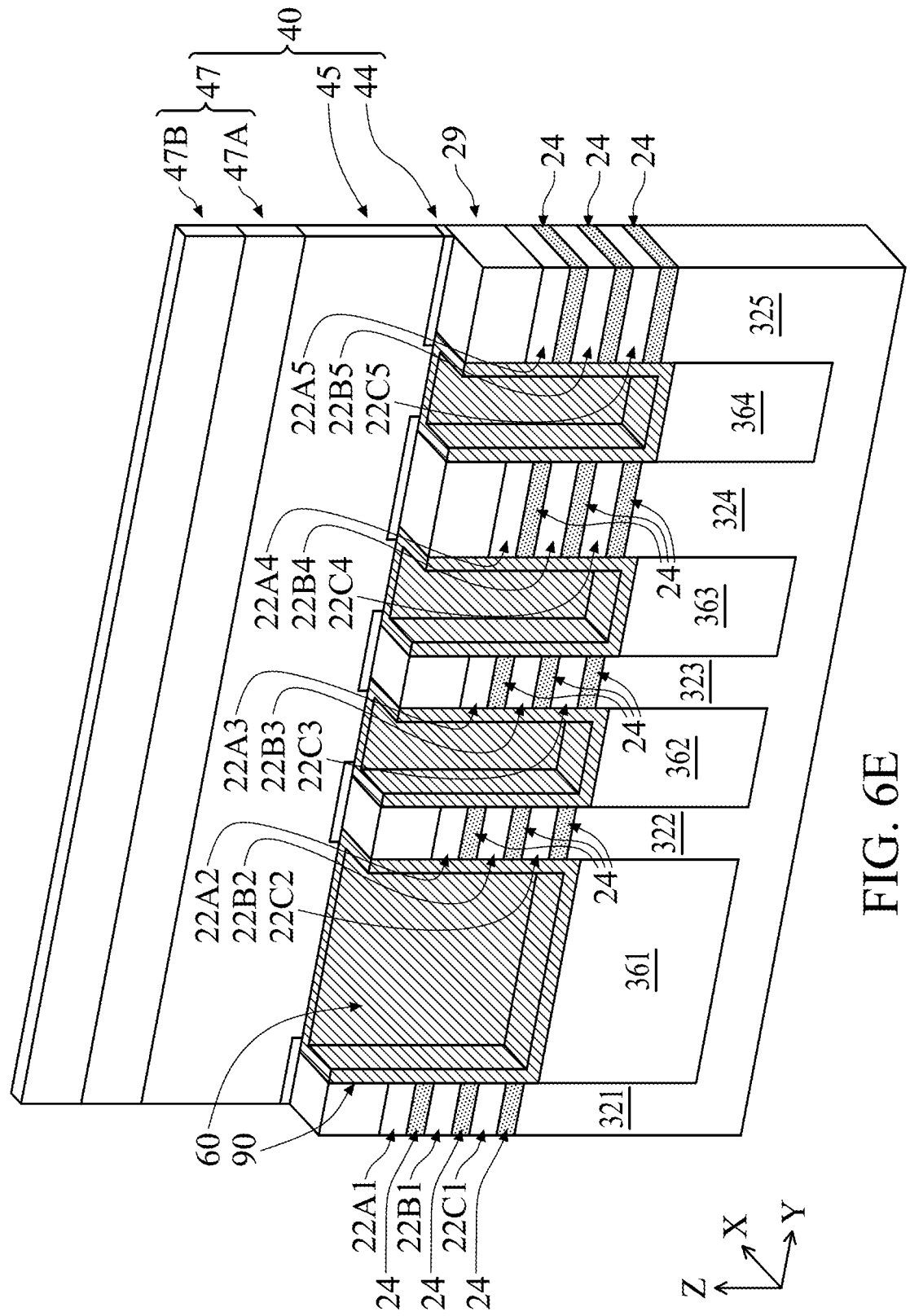
Figure 7:
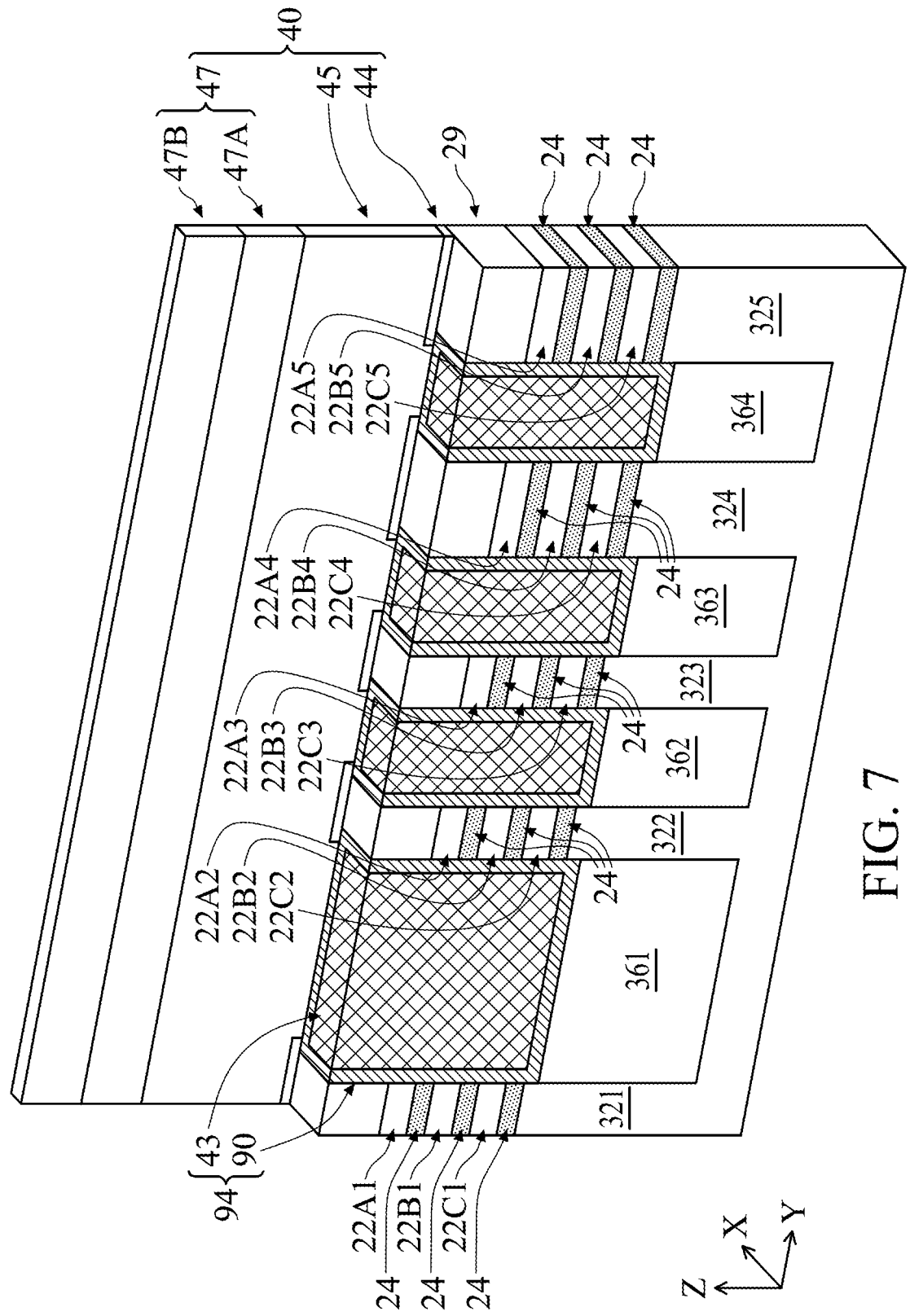

FIGS. 6A-7 illustrate formation of inactive fins 94, corresponding to operation 1300 of FIG. 13. In FIG. 6A, a first dielectric layer 90 used for forming the inactive fins 94 is formed laterally between the fin stacks 26, vertically over the isolation regions 361-364 and over sidewalls of the dummy gate structure 40. The first dielectric layer 90 may be formed of a low-k dielectric material, such as SiOCN. The first dielectric layer 90 can have a thickness in the range of about 6 nm to about 30 nm. The first dielectric layer 90 is formed conformally over upper surfaces of the isolation regions 361-364 and on sidewalls of the fin stacks 26 and the dummy gate layer 45, such that cavities 60 are present, as shown in FIG. 6A.

In FIG. 6B, following deposition of the first material, a second material 62, such as spin-on carbon (SOC), may be deposited conformally over the first material. A planarization operation, such as chemical mechanical planarization (CMP), may be performed to remove excess first and second material from over the dummy gate structures 40.

In FIG. 6C, following the CMP operation, a first etching operation, such as an etch back operation, may be used to remove portions of the second material from over the fin stacks 26 and isolation regions 361-364, leaving the second material only in the cavities 60, as shown.

In FIG. 6D, following the first etching operation, a second etching operation may be performed which removes portions of the first material overlying the fin stacks 26. The second etching operation may utilize the hard mask layer 29 as an etch stop layer when removing the first material from over the fin stacks 26.

In FIG. 6E, after the second etching operation, remaining portions of the second material may be removed by a third etching operation, leaving the first dielectric layer 90 as shown. Following the third etching operation, which is selective to the second material, portions of the first dielectric layer 90 are present on upper surfaces of the isolation regions 361-364, lateral sidewalls of the fin structures 26, and lateral sidewalls of the dummy gate structure 40 between the fin stacks 26.

In FIG. 7, a second dielectric layer 43 is formed in the cavities 60 (see FIG. 6E) between the neighboring sidewalls of first dielectric layer 90, as shown. The second dielectric layer 43 includes a high-k dielectric material, which may refer to dielectric materials having a high dielectric constant that is greater than a dielectric constant of silicon oxide ($k \approx 3.9$). Exemplary high-k dielectric materials include $HfO_2$, HfSiO, HfSiON, HfTaO, HfTiO, HfZrO, $ZrO_2$, $Ta_2O_5$, or combinations thereof. The second dielectric layer 43 fills in the cavities 60, such that top surfaces of the second dielectric layer 43 are substantially coplanar with top surfaces of the dielectric layer 90. In some embodiments, the second dielectric layer 43 is formed by a deposition process, such as CVD, ALD, or another suitable process. The deposition process may be followed by an etching process, such as an isotropic etch process, to remove excess material of the second dielectric layer 43 outside of the cavities 60, e.g., on an upper surface and upper sidewalls of the hard mask layer 29.

Figure 8:
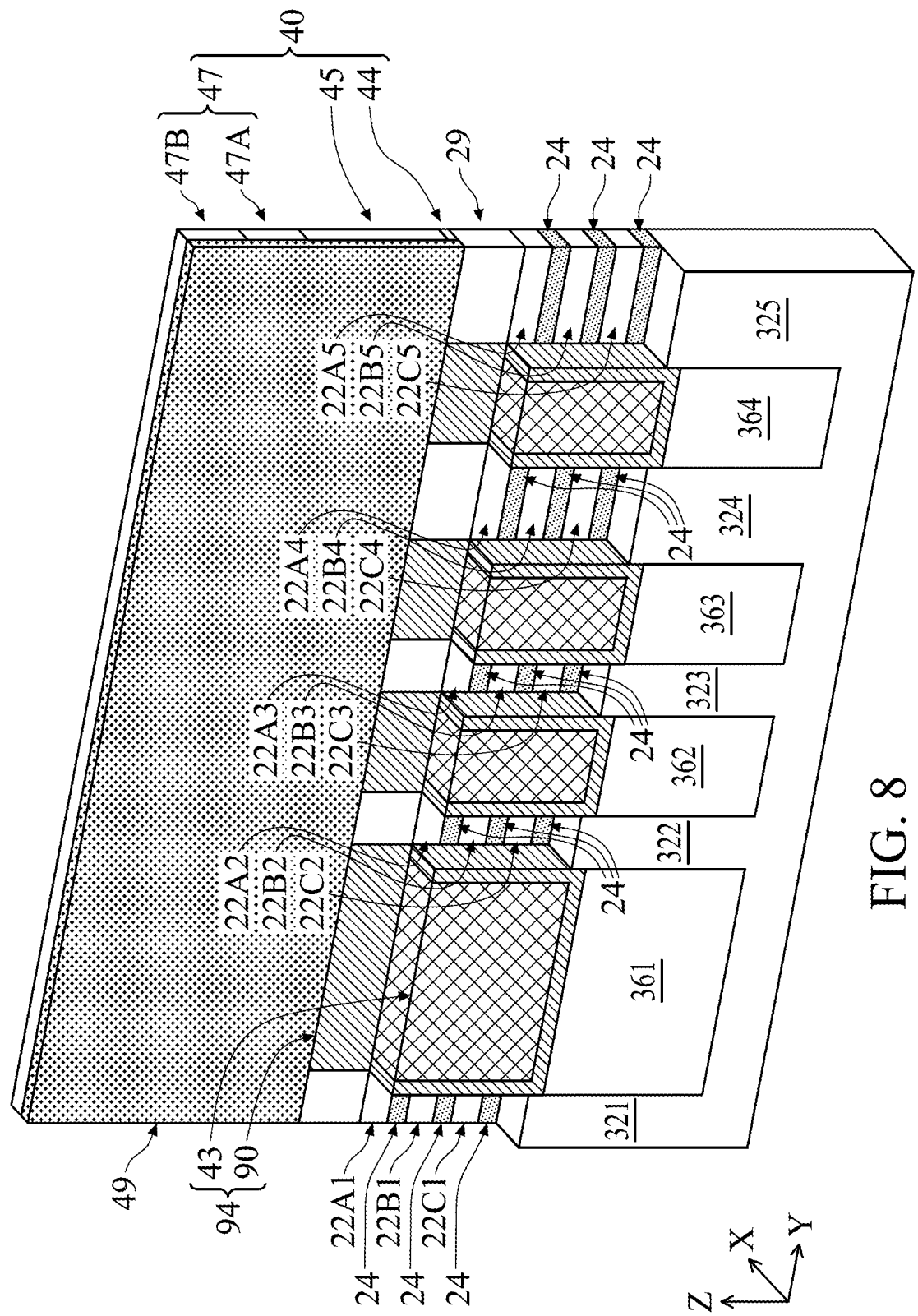

In FIG. 8, a spacer layer 49 is formed over the mask layer 47, the dummy gate layer 45, the gate dielectric layer 44, the hard mask layer 29, the oxide layer 28 (if present), the nanostructures 22, 24, the inactive fins 94 and the isolation regions 361-364, e.g., by a conformal deposition process. The spacer layer 49 is or comprises an insulating material, such as silicon nitride, silicon oxide, silicon carbo-nitride, silicon oxynitride, silicon oxy carbo-nitride, amorphous silicon, or the like.

Following deposition of the spacer layer 49, horizontal (X-Y plane) surfaces of the spacer layer 49 are removed, then one or more etching processes are performed to etch the portions of protruding fins 321-325 and/or nanostructures 22, 24 that are not covered by dummy gate structures 40 and the spacer layer 49, resulting in the structure shown in FIG. 8. The etching may be anisotropic, such that the portions of fins 321-325 directly underlying dummy gate structures 40 and the spacer layer 49 are protected, and are not etched. The top surfaces of the recessed fins 321-325 may be substantially coplanar with the top surfaces of the isolation regions 361-364, or slightly above the top surfaces of the isolation regions 361-364, as shown in FIG. 8, in accordance with some embodiments.

Figure 9:
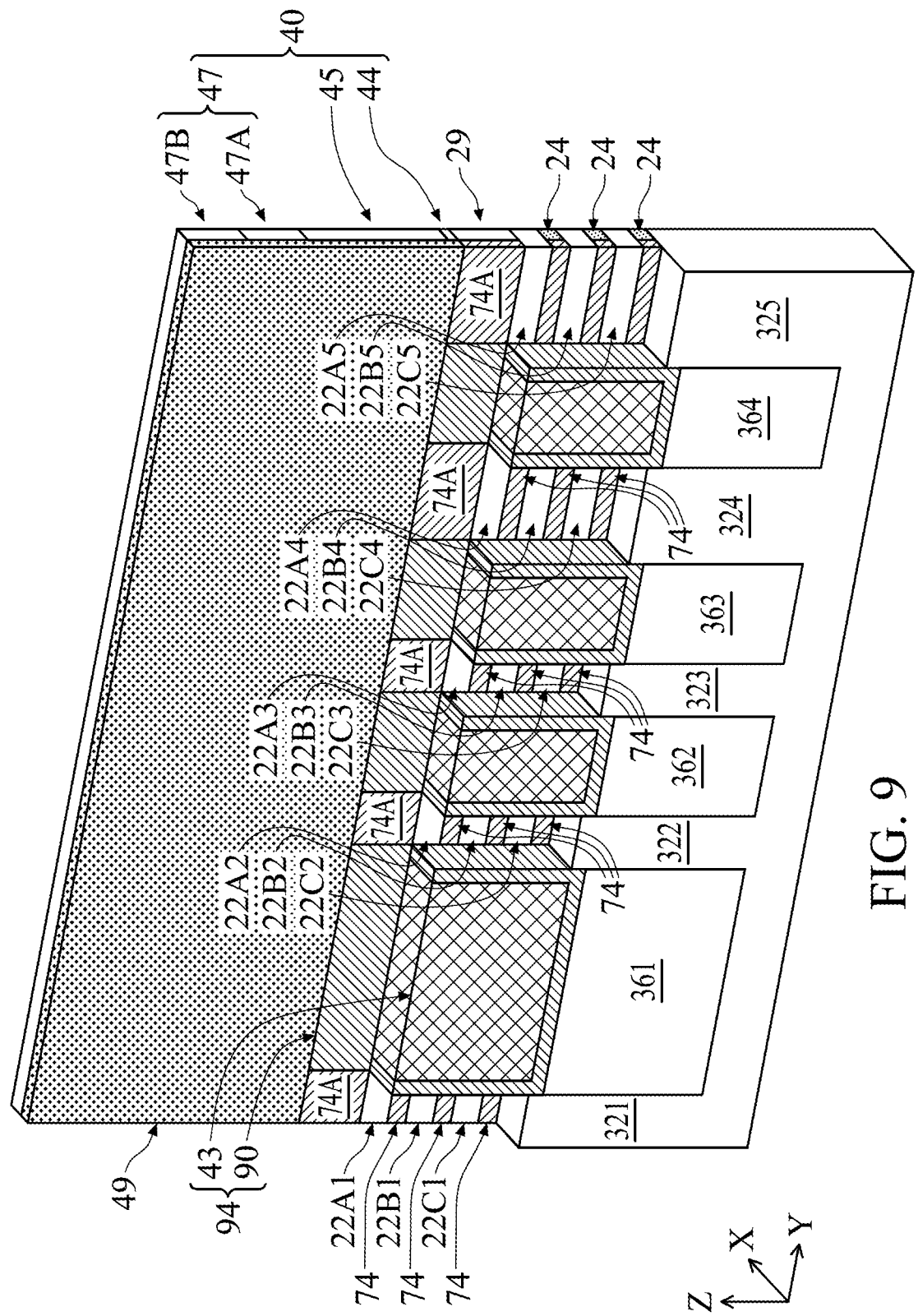

FIG. 9 illustrates formation of inner spacers 74, 74A. A selective etching process is performed to recess exposed end portions of the nanostructures 24 without substantially attacking the nanostructures 22, and to recess exposed portions of the hard mask layer 29. After the selective etching process, recesses are formed in the nanostructures 24 at locations where the removed end portions used to be. Next, an inner spacer layer is formed to fill the recesses between the nanostructures 22 formed by the previous selective etching process. The inner spacer layer may be a suitable dielectric material, such as silicon carbon nitride (SiCN), silicon oxycarbonitride (SiOCN), or the like, formed by a suitable deposition method such as PVD, CVD, ALD, or the like. The inner spacer layer may further fill the recesses in the hard mask layer 29. An etching process, such as an anisotropic etching process, is performed to remove portions of the inner spacer layers disposed outside the recesses in the nanostructures 24 and the hard mask layer 29. The remaining portions of the inner spacer layers (e.g., portions disposed inside the recesses in the nanostructures 24) form the inner spacers 74, 74A. The resulting structure is shown in FIG. 9.

Figure 10:
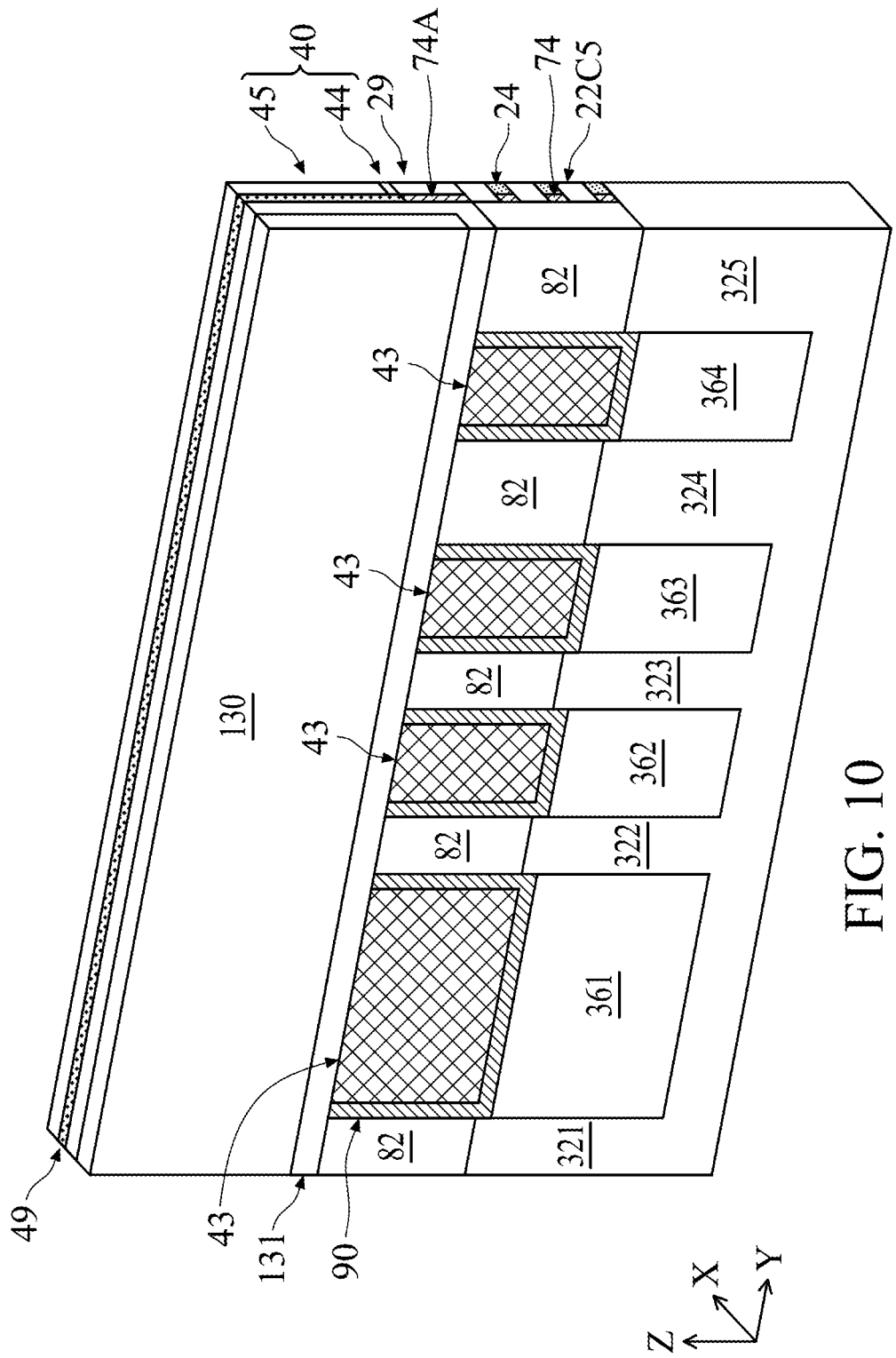

FIG. 10 illustrates formation of the source/drain regions 82 between the inactive fins 94, corresponding to operation 1400 of FIG. 13. In the illustrated embodiment, the source/drain regions 82 are epitaxially grown from epitaxial material(s). In some embodiments, due to reduced spacing between the inactive fins 94, the source/drain regions 82 are grown substantially without lateral growth. In some embodiments, the source/drain regions 82 exert stress in the respective channels 22A1-22C5, thereby improving performance. The source/drain regions 82 are formed such that the dummy gate structure 40 is disposed between respective neighboring pairs of the source/drain regions 82, for example, along the X-direction. In some embodiments, the spacer layer 49 and the inner spacers 74, separate the source/drain regions 82 from the dummy gate layer 45 by an appropriate lateral distance to prevent electrical bridging to subsequently formed gates of the resulting device.

The source/drain regions 82 may include any acceptable material, such as appropriate for n-type or p-type devices. For n-type devices, the source/drain regions 82 include materials exerting a tensile strain in the channel regions, such as silicon, SiC, SiCP, SiP, or the like, in some embodiments. When p-type devices are formed, the source/drain regions 82 include materials exerting a compressive strain in the channel regions, such as SiGe, SiGeB, Ge, GeSn, or the like, in accordance with certain embodiments. The source/drain regions 82 may have surfaces raised from respective surfaces of the fins and may have facets. Neighboring source/drain regions 82 may merge in some embodiments to form a singular source/drain region 82 adjacent two neighboring fins 321-325.

The source/drain regions 82 may be implanted with dopants followed by an anneal. The source/drain regions may have an impurity concentration of between about $10^{19}$ $cm^{-3}$ and about $10^{21}$ $cm^{-3}$. N-type and/or p-type impurities for source/drain regions 82 may be any of the impurities previously discussed. In some embodiments, the source/drain regions 82 are in situ doped during growth.

A contact etch stop layer (CESL) 131 and interlayer dielectric (ILD) 130 may then be formed covering the source/drain regions 82. Prior to removal of the nanostructures 24, the mask layer 47, and the dummy gate layer 45 (described with reference to FIG. 11), the ILD 130 is deposited over the source/drain features 82 and the inactive fins 94. The etch stop layer 131 may be formed prior to deposition of the ILD 130. Following deposition of the ILD 130, the ILD 130 may be recessed slightly, and a second etch stop layer (not shown in the figures) may be formed over the ILD 130 in the recess. A CMP operation or the like may then be performed to remove excess material of the second etch stop layer 132, such that an upper surface of the second etch stop layer 132 is substantially planar with upper surfaces of the etch stop layer 131 and the gate spacers 49.

Figure 11:
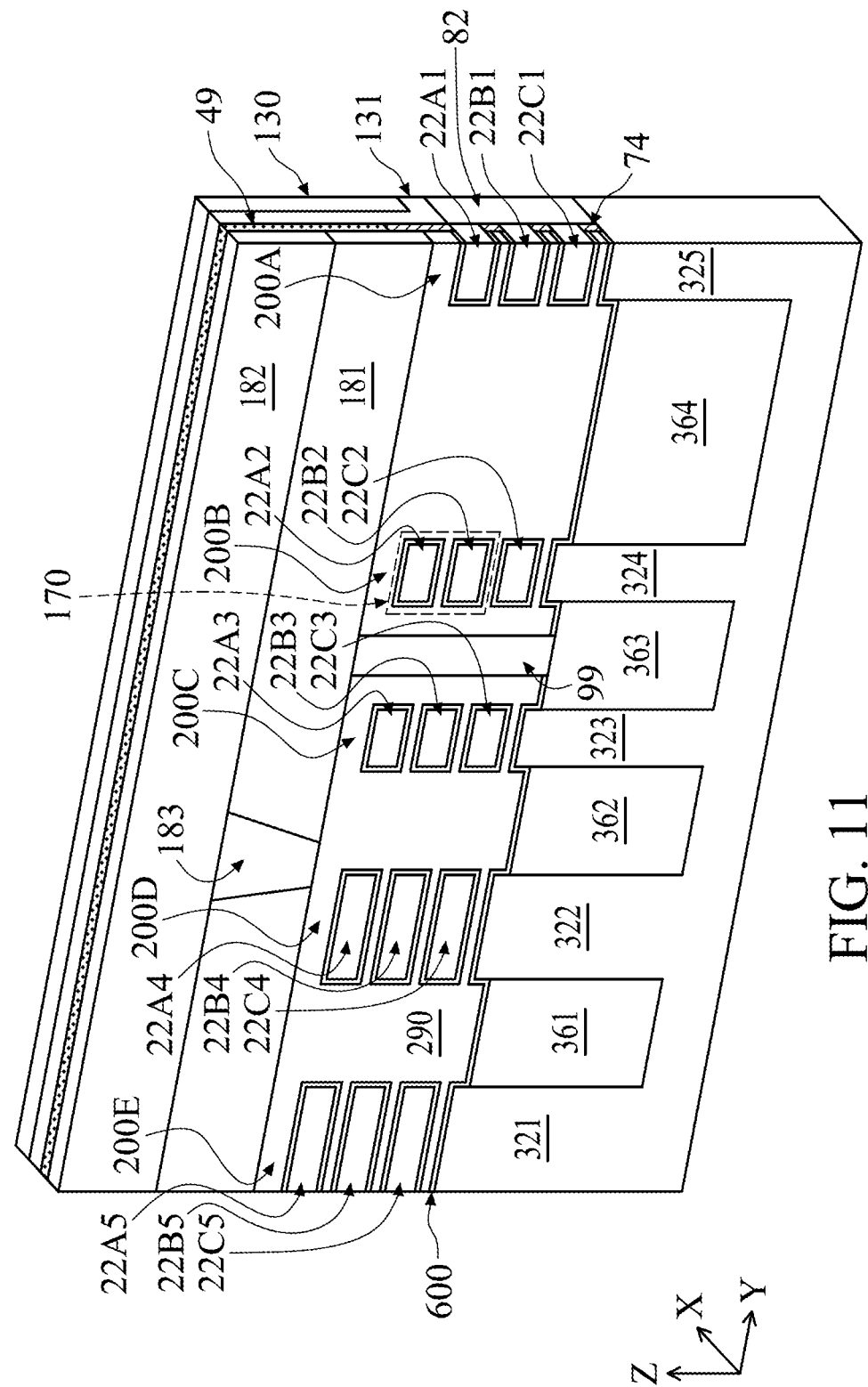

In FIG. 11, fin channels 22A1-22C5 are released by removal of the nanostructures 24, the mask layer 47, and the dummy gate layer 45, which corresponds to operation 1500 of FIG. 13. Prior to release, a planarization process, such as a CMP, is performed to level the top surfaces of the dummy gate layer 45, the gate spacer layer 41, the CESL 131 and the ILD 130. The planarization process may also remove the mask layer 47 on the dummy gate layer 45, and portions of the gate spacer layer 41 along sidewalls of the mask layer 47. Accordingly, the top surfaces of the dummy gate layer 45 are exposed.

Next, the dummy gate layer 45 is removed in an etching process, so that recesses are formed. In some embodiments, the dummy gate layer 45 is removed by an anisotropic dry etch process. For example, the etching process may include a dry etch process using reaction gas(es) that selectively etch the dummy gate layer 45 without etching the spacer layer 49. The dummy gate dielectric 44, when present, may be used as an etch stop layer when the dummy gate layer 45 is etched. The dummy gate dielectric 44 may then be removed after the removal of the dummy gate layer 45.

The nanostructures 24 are removed to release the nanostructures 22. After the nanostructures 24 are removed, the nanostructures 22 form a plurality of nanosheets that extend horizontally (e.g., parallel to a major upper surface of the substrate 110). The nanosheets may be collectively referred to as the channels 22 of the GAA devices 20A-20E formed.

In some embodiments, the nanostructures 24 are removed by a selective etching process using an etchant that is selective to the material of the nanostructures 24, such that the nanostructures 24 are removed without substantially attacking the nanostructures 22. In some embodiments, the etching process is an isotropic etching process using an etching gas, and optionally, a carrier gas, where the etching gas comprises $F_2$ and HF, and the carrier gas may be an inert gas such as Ar, He, $N_2$, combinations thereof, or the like.

In some embodiments, the nanostructures 24 are removed and the nanostructures 22 are patterned to form channel regions of both PFETs and NFETs. In some other embodiments, the nanostructures 22 may be removed and the nanostructures 24 may be patterned to form channel regions of both PFETs and NFETs.

In some embodiments, the nanosheets 22 of the GAA devices 20A-20E are reshaped (e.g., thinned) by a further etching process to improve gate fill window. The reshaping may be performed by an isotropic etching process selective to the nanosheets 22. After reshaping, the nanosheets 22 may exhibit the dog bone shape in which middle portions of the nanosheets 22 are thinner than peripheral portions of the nanosheets 22 along the X direction.

Replacement gates 200, such as the gate structures 200A-200E, are formed, corresponding to operation 1600 of FIG. 13. FIG. 12 is a detailed view of the region 170 of FIG. 11 corresponding to a portion of the gate structure 200B. Each replacement gate 200A-200E, as illustrated by the gate structure 200B in FIG. 12, generally includes the interfacial layer (IL, or "first IL" below) 210, at least one gate dielectric layer 600, the work function metal layer 900, and the gate fill layer 290. In some embodiments, each replacement gate 200A-200E further includes at least one of a second interfacial layer 240 or a second work function layer 700.

With reference to FIG. 12, in some embodiments, the first IL 210 includes an oxide of the semiconductor material of the substrate 110, e.g., silicon oxide. In other embodiments, the first IL 210 may include another suitable type of dielectric material. The first IL 210 has a thickness in a range between about 5 angstroms and about 50 angstroms.

Still referring to FIG. 12, the gate dielectric layer 600 is formed over the first IL 210. In some embodiments, an atomic layer deposition (ALD) process is used to form the gate dielectric layer 600 to control thickness of the deposited gate dielectric layer 600 with precision. In some embodiments, the ALD process is performed using between about 40 and 80 deposition cycles, at a temperature range between about 200 degrees Celsius and about 300 degrees Celsius. In some embodiments, the ALD process uses HfCl4 and/or H2O as precursors. Such an ALD process may form the first gate dielectric layer 220 to have a thickness in a range between about 10 angstroms and about 100 angstroms.

In some embodiments, the gate dielectric layer 600 includes a high-k dielectric material, which may refer to dielectric materials having a high dielectric constant that is greater than a dielectric constant of silicon oxide (k≈3.9). Exemplary high-k dielectric materials include $HfO_2$, HfSiO, HfSiON, HfTaO, HfTiO, HfZrO, $ZrO_2$, $Ta_2O_5$, or combinations thereof. In other embodiments, the gate dielectric layer 600 may include a non-high-k dielectric material such as silicon oxide. In some embodiments, the gate dielectric layer 600 includes more than one high-k dielectric layer, of which at least one includes dopants, such as lanthanum, magnesium, yttrium, or the like, which may be driven in by an annealing process to modify threshold voltage of the GAA device 20B.

With further reference to FIG. 12, the second IL 240 is formed on the gate dielectric layer 600, and the second work function layer 700 is formed on the second IL 240. The second IL 240 promotes better metal gate adhesion on the gate dielectric layer 600. In many embodiments, the second IL 240 further provides improved thermal stability for the gate structure 200B, and serves to limit diffusion of metallic impurity from the work function metal layer 900 and/or the work function barrier layer 700 into the gate dielectric layer 600. In some embodiments, formation of the second IL 240 is accomplished by first depositing a high-k capping layer (not illustrated for simplicity) on the gate dielectric layer 600. The high-k capping layer comprises one or more of the following: HfSiON, HfTaO, HfTiO, HfTaO, HfAlON, HfZrO, or other suitable materials, in various embodiments. In a specific embodiment, the high-k capping layer comprises titanium silicon nitride (TiSiN). In some embodiments, the high-k capping layer is deposited by an ALD using about 40 to about 100 cycles at a temperature of about 400 degrees C. to about 450 degrees C. A thermal anneal is then performed to form the second IL 240, which may be or comprise TiSiNO, in some embodiments. Following formation of the second IL 240 by thermal anneal, an atomic layer etch (ALE) with artificial intelligence (AI) control may be performed in cycles to remove the high-k capping layer while substantially not removing the second IL 240. Each cycle may include a first pulse of $WCl_5$, followed by an Ar purge, followed by a second pulse of $O_2$, followed by another Ar purge. The high-k capping layer is removed to increase gate fill window for further multiple threshold voltage tuning by metal gate patterning.

Further in FIG. 12, after forming the second IL 240 and removing the high-k capping layer, the work function barrier layer 700 is optionally formed on the gate structure 200B, in accordance with some embodiments. The work function barrier layer 700 is or comprises a metal nitride, such as TiN, WN, MoN, TaN, or the like. In a specific embodiment, the work function barrier layer 700 is TiN. The work function barrier layer 700 may have thickness ranging from about 5 A to about 20 A. Inclusion of the work function barrier layer 700 provides additional threshold voltage tuning flexibility. In general, the work function barrier layer 700 increases the threshold voltage for NFET transistor devices, and decreases the threshold voltage (magnitude) for PFET transistor devices.

The work function metal layer 900, which may include at least one of an N-type work function metal layer, an in-situ capping layer, or an oxygen blocking layer, is formed on the work function barrier layer 700, in some embodiments. The N-type work function metal layer is or comprises an N-type metal material, such as TiAlC, TiAl, TaAlC, TaAl, or the like. The N-type work function metal layer may be formed by one or more deposition methods, such as CVD, PVD, ALD, plating, and/or other suitable methods, and has a thickness between about 10 A and 20 A. The in-situ capping layer is formed on the N-type work function metal layer. In some embodiments, the in-situ capping layer is or comprises TiN, TiSiN, TaN, or another suitable material, and has a thickness between about 10 A and 20 A. The oxygen blocking layer is formed on the in-situ capping layer to prevent oxygen diffusion into the N-type work function metal layer, which would cause an undesirable shift in the threshold voltage. The oxygen blocking layer is formed of a dielectric material that can stop oxygen from penetrating to the N-type work function metal layer, and may protect the N-type work function metal layer from further oxidation. The oxygen blocking layer may include an oxide of silicon, germanium, SiGe, or another suitable material. In some embodiments, the oxygen blocking layer is formed using ALD and has a thickness between about 10 A and about 20 A.

FIG. 12 further illustrates the metal fill layer 290. In some embodiments, a glue layer (not separately illustrated) is formed between the oxygen blocking layer of the work function metal layer and the metal fill layer 290. The glue layer may promote and/or enhance the adhesion between the metal fill layer 290 and the work function metal layer 900. In some embodiments, the glue layer may be formed of a metal nitride, such as TiN, TaN, MoN, WN, or another suitable material, using ALD. In some embodiments, thickness of the glue layer is between about 10 A and about 25 A. The metal fill layer 290 may be formed on the glue layer, and may include a conductive material such as tungsten, cobalt, ruthenium, iridium, molybdenum, copper, aluminum, or combinations thereof. In some embodiments, the metal fill layer 290 may be deposited using methods such as CVD, PVD, plating, and/or other suitable processes. In some embodiments, a seam 510, which may be an air gap, is formed in the metal fill layer 290 vertically between the channels 22A2, 22B2. In some embodiments, the metal fill layer 290 is conformally deposited on the work function metal layer 900. The seam 510 may form due to sidewall deposited film merging during the conformal deposition. In some embodiments, the seam 510 is not present between the neighboring channels 22A2, 22B2.

At this point, all of the gate structures 200A-200E are electrically connected to each other. In some embodiments, at least one dielectric plug 99 is formed abutting at least one of the inactive fins 94, corresponding to operation 1700 of FIG. 13. In FIG. 11, mask layers, including a first mask layer and a hard mask layer, may be formed over the gate structures 200A-200E, for example, laterally between the spacer layer 49. The first mask layer may include silicon, such as polycrystalline silicon or amorphous silicon. The thickness of the first mask layer may be in a range from about 100 nm to about 200 nm, in some embodiments. In some embodiments, the first mask layer is subjected to a planarization operation. The first mask layer and the hard mask layer are deposited using any suitable processes, including spin coating, LPCVD, PECVD, PVD, ALD, or other suitable processes. The hard mask layer may include one or more layers of SiN, SOC, or the like, in accordance with some embodiments.

The hard mask layer and the first mask layer are subsequently etched to form openings over and exposing certain of the isolation regions 361-364, such as the isolation region 363 shown in FIG. 11. To form the openings, in some embodiments, patterned photoresist (not separately illustrated) is formed over the hard mask layer. The photoresist may be patterned by an extreme ultraviolet (EUV) process, or by another suitable process. The hard mask layer may be etched first by an anisotropic etching process selective to the material of the hard mask layer, which forms an upper portion of the openings extending from the upper surface of the hard mask layer to expose the upper surfaces of the first mask layer over the isolation region 363. Following etching of the hard mask layer, the photoresist pattern may be removed, and the hard mask layer may be used as a mask while forming a lower portion of the openings extending from the upper surface of the first mask layer to expose the upper surfaces of the isolation region 363. The lower portion is formed by etching the first mask layer by, for example, an anisotropic etching process selective to the material of the first mask layer.

Following formation of the openings, dielectric plug 99 are formed in the openings, corresponding to operation 1700 of FIG. 13. In some embodiments, the dielectric plug 99 are or include silicon nitride, silicon oxide, $Al_2O_3$, $ZrO_2$ or another suitable material. The dielectric plug 99 may be deposited in the openings by a suitable process, such as CVD and/or other suitable technique. Following deposition of the dielectric plug 99, a removal process, such as CMP, etching or another suitable process, can be performed to remove excess material of the dielectric plug 99 from over the first mask layer, such that upper surfaces of the dielectric plug 99 are substantially level with upper surfaces of the first mask layer. The dielectric plug 99 generally inherit the shape of the openings, such that the dielectric plug 99 over the isolation region 363 is substantially aligned with the isolation region 363. The dielectric plug 99 over the isolation region 363 may have width (in the Y-direction) about $\frac{1}{100}$ to $\frac{3}{4}$ the width of the isolation region 363, and may be aligned over a center (in the Y-direction) of the isolation region 363.

Following formation of the dielectric plug 99, the first mask layer is removed, leaving the dielectric plug 99 over the isolation region 363. In some embodiments, the first mask layer is removed by a reactive ion etch (RIE) process, or other suitable process. At this point, the gate structures 200A, 200B are electrically isolated from the gate structures 200C-200E. While three neighboring gate structures of the gate structures 200A-200E are electrically connected in the figures, it is appreciated that two or four or more neighboring gate structures may be electrically connected with proper placement of the dielectric plug 99, in some embodiments.

Further to FIG. 11, a dielectric layer 181 may be formed overlying the gate structures 200A-200E and the dielectric plug 99, followed by formation of a conductive layer 182 over the dielectric layer 181. In some embodiments, a conductive plug 183 is formed in the dielectric layer 182 electrically connecting the conductive layer 182 to the gate structures 200A-200C, as shown.

Additional processing may be performed to finish fabrication of the GAA devices 20A-20E. For example, gate contacts (not illustrated for simplicity) may be formed to electrically couple to the gate structures 200A-200E. An interconnect structure may then be formed over the source/drain contacts 120 and the gate contacts. The interconnect structure may include a plurality of dielectric layers surrounding metallic features, including conductive traces and conductive vias, which form electrical connection between devices on the substrate 110, such as the GAA devices 20A-20E, as well as to IC devices external to the IC device 10.

Embodiments may provide advantages. Inactive fins 94 are formed only between epitaxial source/drain regions 82, which maintains the advantage of improved epitaxial bridge window while allowing reduced spacing between fin structures 26 near the gate structures 200A-200E, such as by about 10 nm to about 15 nm or more.

In accordance with at least one embodiment, a device comprises a substrate; a first stack of semiconductor nanostructures vertically overlying the substrate; a gate structure surrounding the semiconductor nanostructures and abutting an upper side and first and second lateral sides of the first stack; a first epitaxial region laterally abutting a third lateral side of the first stack; a second epitaxial region laterally abutting a fourth lateral side of the first stack; a first inactive fin laterally abutting the first epitaxial region; and a second inactive fin laterally abutting the second epitaxial region and physically separated from the first inactive fin by the gate structure.

In accordance with at least one embodiment, a device comprises a substrate; a first semiconductor channel vertically overlying the substrate; a second semiconductor channel vertically overlying the substrate and laterally offset from the first semiconductor channel in a first direction; a first gate structure laterally between the first semiconductor channel and the second semiconductor channel; a second gate structure laterally between the first semiconductor channel and the second semiconductor channel; a gate isolation structure between the first semiconductor channel and the second semiconductor channel, extending in the first direction from a first sidewall of the first gate structure to a second sidewall of the second gate structure; a first epitaxial region laterally abutting the first semiconductor channel in a second direction perpendicular the first direction; a second epitaxial region laterally abutting the second semiconductor channel in the second direction; and an inactive fin structure between the first epitaxial region and the second epitaxial region in the first direction, and laterally abutting the gate isolation feature in the second direction.

In accordance with at least one embodiment, a method comprises: forming a first fin stack and a second fin stack vertically over a substrate extending in a first lateral direction and separated in a second lateral direction perpendicular to the first lateral direction; forming a sacrificial gate structure over the first and second fin stacks extending in the second lateral direction; forming a first inactive fin structure abutting the first fin stack, the second fin stack and a first side of the sacrificial gate structure; forming a second inactive fin structure abutting the first fin stack, the second fin stack and a second side of the sacrificial gate structure opposite the first side; forming a first epitaxial feature abutting the first inactive fin structure and the first fin stack; and forming a second epitaxial feature abutting the first inactive fin structure and the second fin stack.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
a substrate;
a first stack of semiconductor nanostructures vertically overlying the substrate;
a gate structure surrounding the first stack of semiconductor nanostructures and abutting an upper side and first and second lateral sides of the first stack, the first and second lateral sides being opposite each other;
a first epitaxial region laterally abutting a third lateral side of the first stack;
a second epitaxial region laterally abutting a fourth lateral side of the first stack, the fourth lateral side being opposite the third lateral side, and the second epitaxial region spaced apart from the first epitaxial region in a first direction;
a first inactive fin laterally abutting the first epitaxial region in a second direction transverse to the first direction; and
a second inactive fin laterally abutting the second epitaxial region in the second direction transverse to the first direction, and each of the first and second inactive fins laterally abuts the gate structure on opposite sides of the gate structure such that the second inactive fin is physically separated from the first inactive fin by the gate structure.

2. The device of claim 1, further comprising:
a gate isolation structure laterally abutting the gate structure.

3. The device of claim 2, wherein the gate isolation structure laterally abuts the first inactive fin and the second inactive fin.

4. The device of claim 3, wherein the gate structure laterally abuts the first inactive fin and the second inactive fin.

5. The device of claim 4, further comprising:
a third inactive fin laterally abutting the first epitaxial region on a side of the first epitaxial region opposite the first inactive fin; and
a fourth inactive fin laterally abutting the second epitaxial region on a side of the second epitaxial region opposite the second inactive fin.

6. The device of claim 5, wherein the gate structure laterally abuts the third inactive fin and the fourth inactive fin.

7. The device of claim 2, wherein:
the first inactive fin includes:
a first liner layer of a first dielectric material; and
a first fill layer of a second dielectric material different from the first dielectric material; and
the second inactive fin includes:
a second liner layer of the first dielectric material; and
a second fill layer of the second dielectric material.

8. The device of claim 7, wherein:
the first dielectric material has a first dielectric constant; and
the second dielectric material has a second dielectric constant higher than the first dielectric constant.

9. The device of claim 8, wherein the gate isolation structure has a third dielectric material of different etch selectivity than the first dielectric material.

10. A device comprising:
a substrate;
a first semiconductor channel vertically overlying the substrate;
a second semiconductor channel vertically overlying the substrate and laterally offset from the first semiconductor channel in a first direction;
a first gate structure laterally between the first semiconductor channel and the second semiconductor channel;
a second gate structure laterally between the first semiconductor channel and the second semiconductor channel;
a gate isolation structure between the first semiconductor channel and the second semiconductor channel, extending in the first direction from a first sidewall of the first gate structure to a second sidewall of the second gate structure;
a first epitaxial region laterally abutting the first semiconductor channel in a second direction perpendicular the first direction;
a second epitaxial region laterally abutting the second semiconductor channel in the second direction; and
an inactive fin structure between the first epitaxial region and the second epitaxial region in the first direction, and laterally abutting the gate isolation structure in the second direction.

11. The device of claim 10, wherein the inactive fin structure further abuts the first gate structure and the second gate structure in the second direction.

12. The device of claim 10, further comprising:
a third epitaxial region opposite the first semiconductor channel from the first epitaxial region;
a fourth epitaxial region opposite the second semiconductor channel from the second epitaxial region; and
a second inactive fin structure between the third epitaxial region and the fourth epitaxial region in the first direction, and laterally abutting the gate isolation structure opposite the inactive fin structure.

13. The device of claim 10, wherein the gate isolation structure includes a dielectric material having a different etch selectivity than a dielectric material of the inactive fin structure.

14. A device, comprising:
a stack of semiconductor nanostructures;
a gate structure adjacent the stack of semiconductor nanostructures;
a first source/drain laterally abutting the stack of semiconductor nanostructures;
a second source/drain laterally abutting the stack of semiconductor nanostructures opposite the first source/drain along a first direction;
a first inactive fin laterally abutting the first source/drain along a second direction transverse the first direction;
a second inactive fin laterally abutting the second source/drain along the second direction and physically separated from the first inactive fin by the gate structure; and
a gate isolation structure positioned between the first inactive fin and the second inactive fin.

15. The device of claim 14, wherein:
the first inactive fin includes:
a first liner layer including a first dielectric material; and
a first fill layer including a second dielectric material different than the first dielectric material; and
the second inactive fin includes:
a second liner layer including the first dielectric material; and
a second fill layer including the second dielectric material.

16. The device of claim 15, wherein:
the first dielectric material has a first dielectric constant; and
the second dielectric material has a second dielectric constant higher than the first dielectric constant.

17. The device of claim 16, wherein the gate isolation structure has a third dielectric material having different etch selectivity than that of the first dielectric material.

18. The device of claim 14, wherein width of the first inactive fin along the first direction exceeds width of the first source/drain along the first direction.

19. The device of claim 14, wherein a portion of the first inactive fin extends to a height above the stack of semiconductor nanostructures.

20. The device of claim 19, further comprising:
a first inner spacer that is positioned between two of the semiconductor nanostructures of the stack of semiconductor nanostructures; and
a second inner spacer that is positioned above the stack of semiconductor nanostructures, the second inner spacer extending to a height above the stack of semiconductors that is equal to the height to which the portion of the first inactive fin extends.

* * * * *